US012431879B2

(12) United States Patent
Cohen et al.

(10) Patent No.: US 12,431,879 B2
(45) Date of Patent: Sep. 30, 2025

(54) CLASSICAL PROCESSOR FOR QUANTUM CONTROL

(71) Applicant: Quantum Machines, Tel Aviv (IL)

(72) Inventors: Yonatan Cohen, Tel Aviv (IL); Nissim Ofek, Tel Aviv (IL); Itamar Sivan, Tel Aviv (IL); Nir Halay, Tel Aviv (IL); Ori Weber, Tel Aviv (IL)

(73) Assignee: Q.M Technologies Ltd. (IL)

( * ) Notice: Subject to any disclaimer, the term of this patent is extended or adjusted under 35 U.S.C. 154(b) by 14 days.

(21) Appl. No.: 17/020,135

(22) Filed: Sep. 14, 2020

(65) Prior Publication Data

US 2021/0091755 A1 Mar. 25, 2021

Related U.S. Application Data

(60) Provisional application No. 62/905,658, filed on Sep. 25, 2019.

(51) Int. Cl.
*H03K 3/38* (2006.01)
*G06N 10/40* (2022.01)
*G06N 10/80* (2022.01)
*H03K 19/195* (2006.01)

(52) U.S. Cl.
CPC ............... *H03K 3/38* (2013.01); *G06N 10/40* (2022.01); *G06N 10/80* (2022.01); *H03K 19/195* (2013.01)

(58) Field of Classification Search
CPC ........ G06N 10/00; G06N 10/60; G06N 10/20; G06N 10/40; H03K 3/38; H03K 19/195
See application file for complete search history.

(56) References Cited

U.S. PATENT DOCUMENTS

| 4,875,484 | A  | 10/1989 | Anzai et al. |
|-----------|----|---------|--------------|
| 6,993,108 | B1 | 1/2006  | Chi et al. |
| 7,451,292 | B2 | 11/2008 | Routt |
| 7,627,126 | B1 | 12/2009 | Pikalo |
| 8,315,969 | B2 | 11/2012 | Roetteler |
| 8,385,878 | B2 | 2/2013  | Rao |
| 8,750,717 | B1 | 6/2014  | Yap et al. |
| 9,207,672 | B2 | 12/2015 | Williams |
| 9,400,499 | B2 | 7/2016  | Williams |
| 9,509,324 | B2 | 11/2016 | McDonald et al. |
| 9,692,423 | B2 | 6/2017  | McDermott, III |
| 9,847,121 | B2 | 12/2017 | Frank |
| 9,858,531 | B1 | 1/2018  | Monroe |
| 9,892,365 | B2 | 2/2018  | Rigetti |

(Continued)

FOREIGN PATENT DOCUMENTS

CN   105281886 A   1/2016
CN   105912070 A   8/2016

(Continued)

OTHER PUBLICATIONS

Moreira , (QuTech Central Controller: A Quantum Control Architecture for a Surface-17 Logical Qubit, Delft University of Technology Student Theses Collection, May 10, 2019) (Year: 2019).*

(Continued)

*Primary Examiner* — Patrick C Chen
(74) *Attorney, Agent, or Firm* — McAndrews, Held & Malloy, Ltd.

(57) ABSTRACT

Methods and systems for classical processing in a quantum controller.

20 Claims, 13 Drawing Sheets

(56) References Cited

U.S. PATENT DOCUMENTS

| | | | |
|---|---|---|---|
| 9,978,020 | B1 | 5/2018 | Gambetta |
| 9,979,400 | B1 | 5/2018 | Sete |
| 9,996,801 | B2 | 6/2018 | Shim |
| 10,063,228 | B2 | 8/2018 | Deurloo et al. |
| 10,122,351 | B1 | 11/2018 | Naaman |
| 10,127,499 | B1 | 11/2018 | Rigetti |
| 10,192,168 | B2 | 1/2019 | Rigetti |
| 10,223,643 | B1 | 3/2019 | Bishop et al. |
| 10,333,503 | B1 | 6/2019 | Cohen et al. |
| 10,454,459 | B1 | 10/2019 | Cohen |
| 10,496,069 | B2 | 12/2019 | Nazarathy et al. |
| 10,505,524 | B1 | 12/2019 | Cohen |
| 10,560,076 | B1 | 2/2020 | Cohen |
| 10,637,449 | B1 | 4/2020 | Cohen et al. |
| 10,659,018 | B1 | 5/2020 | Cohen |
| 10,666,238 | B1 | 5/2020 | Cohen |
| 10,958,253 | B1 | 3/2021 | Cohen et al. |
| 10,985,739 | B2 | 4/2021 | Cohen et al. |
| 11,010,145 | B1 | 5/2021 | Smith et al. |
| 2004/0266084 | A1 | 12/2004 | Fujishima et al. |
| 2005/0180575 | A1 | 8/2005 | Maeda et al. |
| 2006/0093376 | A1 | 5/2006 | Mitchell et al. |
| 2013/0198499 | A1* | 8/2013 | Dice .................. G06F 9/3846 712/E9.032 |
| 2016/0125311 | A1 | 5/2016 | Fuechsle et al. |
| 2016/0267032 | A1 | 9/2016 | Rigetti et al. |
| 2016/0292586 | A1 | 10/2016 | Rigetti et al. |
| 2017/0214410 | A1 | 7/2017 | Hincks et al. |
| 2017/0364796 | A1 | 12/2017 | Wiebe |
| 2018/0013426 | A1 | 1/2018 | Deurloo et al. |
| 2018/0032893 | A1 | 2/2018 | Epstein |
| 2018/0091244 | A1 | 3/2018 | Abdo |
| 2018/0123597 | A1 | 5/2018 | Sete |
| 2018/0260245 | A1 | 9/2018 | Smith |
| 2018/0260730 | A1 | 9/2018 | Reagor |
| 2018/0260732 | A1 | 9/2018 | Bloom |
| 2018/0308007 | A1 | 10/2018 | Amin |
| 2018/0322409 | A1 | 11/2018 | Barends |
| 2018/0365585 | A1 | 12/2018 | Smith |
| 2018/0373995 | A1 | 12/2018 | Tomaru et al. |
| 2018/0375650 | A1 | 12/2018 | Legre |
| 2019/0042964 | A1 | 2/2019 | Elsherbini et al. |
| 2019/0042965 | A1 | 2/2019 | Clarke |
| 2019/0042970 | A1* | 2/2019 | Zou .................. G06N 10/00 |
| 2019/0042971 | A1 | 2/2019 | Zou |
| 2019/0042972 | A1 | 2/2019 | Zou |
| 2019/0042973 | A1 | 2/2019 | Zou |
| 2019/0049495 | A1 | 2/2019 | Ofek |
| 2019/0251478 | A1* | 8/2019 | Bishop .................. G06N 10/40 |
| 2019/0385088 | A1 | 12/2019 | Naaman et al. |
| 2020/0364602 | A1 | 11/2020 | Niu et al. |
| 2021/0004707 | A1 | 1/2021 | Gambetta et al. |
| 2021/0103847 | A1 | 4/2021 | Akzam |

FOREIGN PATENT DOCUMENTS

| | | | |
|---|---|---|---|
| CN | 108111306 | A | 6/2018 |
| CN | 110085094 | A | 8/2019 |
| CN | 111464154 | | 7/2020 |
| CN | 111767055 | A | 10/2020 |
| CN | 112019193 | | 12/2020 |
| CN | 112149832 | A | 12/2020 |
| JP | 2011175078 | A | 9/2011 |
| WO | 2015178991 | | 11/2015 |
| WO | 2015178992 | | 11/2015 |
| WO | WO-2015178991 | A2 * | 11/2015 ............. G06F 13/36 |
| WO | 2017078735 | | 5/2017 |
| WO | 2017139683 | A1 | 8/2017 |
| WO | 2018062991 | A1 | 4/2018 |
| WO | 2019063117 | A1 | 4/2019 |
| WO | 2020033807 | A1 | 2/2020 |
| WO | 2020231795 | A1 | 11/2020 |

OTHER PUBLICATIONS

Cross et al. "Open Quantum Assembly Language" (Year: 2017).*
Int'l Preliminary Report on Patentability Appln No. PCT/IB2020/000218 mailed Sep. 16, 2021.
Int'l Preliminary Report on Patentability Appln No. PCT/IB2020/000376 mailed Nov. 12, 2021.
Int'l Search Report and Written Opinion Appln No. PCT/IB2021/056254 mailed Dec. 1, 2021.
Ribeiro, Diogo C., Pedro M. Cruz, and Nuno Borges Carvalho, "Towards a denser frequency grid in phase measurements using mixer-based receivers." 2015 85th Microwave Measurement Conference (ARFTG). IEEE, 2015. Dec. 31, 2015 (Dec. 31, 2015).
Int'l Preliminary Report on Patentability Appln No. PCT/IB2020/000555 mailed Feb. 10, 2022.
Int'l Preliminary Report on Patentability Appln No. PCT/IB2020/000707 mailed Mar. 17, 2022.
Int'l Preliminary Report on Patentability Appln No. PCT/IB2020/000704 mailed Mar. 17, 2022.
Int'l Preliminary Report on Patentability Appln No. PCT/IB2020/000760 mailed Apr. 7, 2022.
Int'l Search Report and Written Opinion Appln No. PCT/IB2022/050190 mailed Apr. 11, 2022.
U.S. Appl. No. 62/294,966, filed Feb. 12, 2016.
Int'l Search Report and Written Opinion Appln No. PCT/IB2019/001410 mailed Jun. 10, 2020.
Int'l Search Report and Written Opinion Appln No. PCT/IB2019/001394 mailed Jun. 17, 2020.
Zhang J, Hegde SS, Suter D. Pulse sequences for controlled 2- and 3-qubit gates in a hybrid quantum register. arXiv preprint arXiv:1806.08408. Jun. 21, 2018.
Wang CY, Kuznetsova L, Gkortsas VM, Diehl L, Kaertner FX, Belkin MA, Belyanin A, Li X, Ham D, Schneider H, Grant P. Mode-locked pulses from mid-infrared quantum cascade lasers. Optics Express. Jul. 20, 2009;17(15):12929-43.
Int'l Search Report and Written Opinion Appln No. PCT/IB2020/000218 mailed Aug. 11, 2020.
Quan R, Zhai Y, Wang M, Hou F, Wang S, Xiang X, Liu T, Zhang S, Dong R. Demonstration of quantum synchronization based on second-order quantum coherence of entangled photons. Scientific reports. Jul. 25, 2016;6:30453. Jul. 25, 2016 (Jul. 25, 2016).
Int'l Search Report and Written Opinion Appln No. PCT/IB2020/000376 mailed Sep. 17, 2020.
Breitfelder et al. eds., IEEE 100: The Authoritative Dictionary of IEEE Standards Terms 1247, definition 2 of "variable" (7th ed. 2000). (Year: 2000).
Int'l Search Report and Written Opinion Appln No. PCT/IB2020/000707 mailed Jan. 12, 2021.
National Academies of Sciences, Engineering, and Medicine. "Quantum Computing: Progress and Prospects". eprint (Dec. 2018) [online]. [retrieved on Jan. 7, 2020]. retrieved from: <https://doi.org/10.17226/25196.> Dec. 4, 2018 (Dec. 4, 2018) pp. 114, 142, 210, Fig. 2.5.
IBM Research. "Qiskit Backend Specifications for OpenQASM and OpenPulse Experiments". eprint arXiv:1809.03452v1 (Sep. 10, 2018) [online]. [retrieved on Jan. 7, 2020]. retrieved from: <https://arxiv.org/pdf/1809.03452.pdf>.
Int'l Search Report and Written Opinion Appln No. PCT/IB2020/000704 mailed Jan. 17, 2021.
Int'l Search Report and Written Opinion Appln No. PCT/IB2020/000555 mailed Dec. 27, 2020.
Pulse Techniques for Quantum Information Processing University of Chicago, University College London Dec. 31, 2016.
Int'l Search Report and Written Opinion Appln No. PCT/IB2020/000760 mailed Jan. 27, 2021.
"Quantum-classical interface based on single flux quantum digital logic". In: Quantum Science and Technology 3.2 (2018), pp. 1-16. DOI: 10.1088/2058-9565/aaa3a0.(retrieved on Jan. 20, 2021). Retrieved from the Internet: < https://arxiv.org/pdf/1710.04645.pdf.
Roffe, J., Quantum Error Correction: An Introductory Guide, Dept. of Physics & Astronomy, Univ. of Sheffeld, UK, Oct. 10, 2019, pp. 1-29.
Int'l Search Report and Written Opinion Appln No. PCT/IB2020/001004 mailed May 13, 2021.

(56) References Cited

OTHER PUBLICATIONS

Int'l Preliminary Report on Patentability Appln No. PCT/IB2019/001410 mailed Jun. 10, 2021.
Int'l Search Report and Written Opinion Appln No. PCT/IB2021/000067 mailed Jun. 21, 2021.
Int'l Preliminary Report on Patentability Appln No. PCT/IB2019/001394 mailed Jul. 29, 2021.
Int'l Search Report and Written Opinion Appln No. PCT/IB2022/000059 mailed Jul. 7, 2022.
Moreira , "QuTech Central Controller: A Quantum Control Architecture for a Surface-17 Logical Qubit." Delft University of Technology Student Theses Collection (2019). Available at the following URL: http://resolver.tudelft.nl/uuid:502ed5e5-87f7-42bd-a077-c24b7281cd94 May 10, 2019 (May 10, 2019).
Int'l Preliminary Report on Patentability Appln No. PCT/IB2020/001004 mailed Jun. 30, 2022.
Int'l Search Report and Written Opinion Appln No. PCT/IB2022/000024 mailed Jul. 18, 2022.
Baier, Simon, Matteo Pompili, Sophie LN Hermans, Hans KC Beukers, Peter C. Humphreys, Raymond N. Schouten, Raymond FL Vermeulen et al. "Realization of a Multi-Node Quantum Network of Remote Solid-State Qubits", Science, vol. 372, p.p. 259-264 (2021) Baier Simon Apr. 16, 2021 (Apr. 16, 2021).
Int'l Search Report and Written Opinion Appln No. PCT/IB2022/000068 mailed Jul. 17, 2022.
D. Copsey et al., "Toward a scalable, silicon-based quantum computing architecture," in IEEE Journal of Selected Topics in Quantum Electronics, vol. 9, No. 6, pp. 1552-1569, Nov.-Dec. 2003, doi: 10.1109/JSTQE.2003.820922. Dec. 31, 2003 (Dec. 31, 2003).
European Office Communication with extended Search Report Appln No. 20869503.1 dated Sep. 12, 2023.

\* cited by examiner

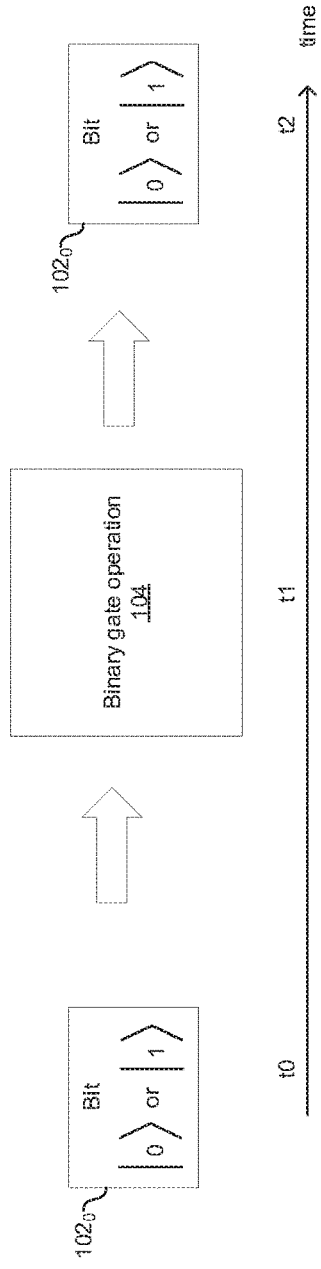
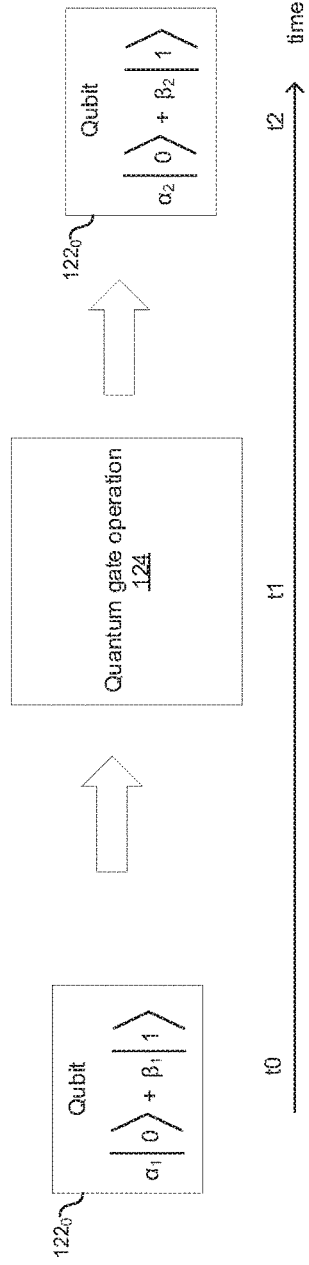
FIG. 1A
FIG. 1B

CLASSICAL PROCESSOR FOR QUANTUM CONTROL

CROSS-REFERENCE TO RELATED APPLICATIONS

This application claims the benefit of provisional application No. 62/905,658, filed Sep. 25, 2019. The aforementioned document is incorporated herein by reference in its entirety.

BACKGROUND

Limitations and disadvantages of conventional approaches to quantum computer control systems will become apparent to one of skill in the art, through comparison of such approaches with some aspects of the present method and system set forth in the remainder of this disclosure with reference to the drawings.

BRIEF SUMMARY

Methods and systems are provided for a quantum controller, substantially as illustrated by and/or described in connection with at least one of the figures, as set forth more completely in the claims.

BRIEF DESCRIPTION OF THE DRAWINGS

FIGS. 1A and 1B compare some aspects of classical (binary) computing and quantum computing.

DETAILED DESCRIPTION

Figure 2:
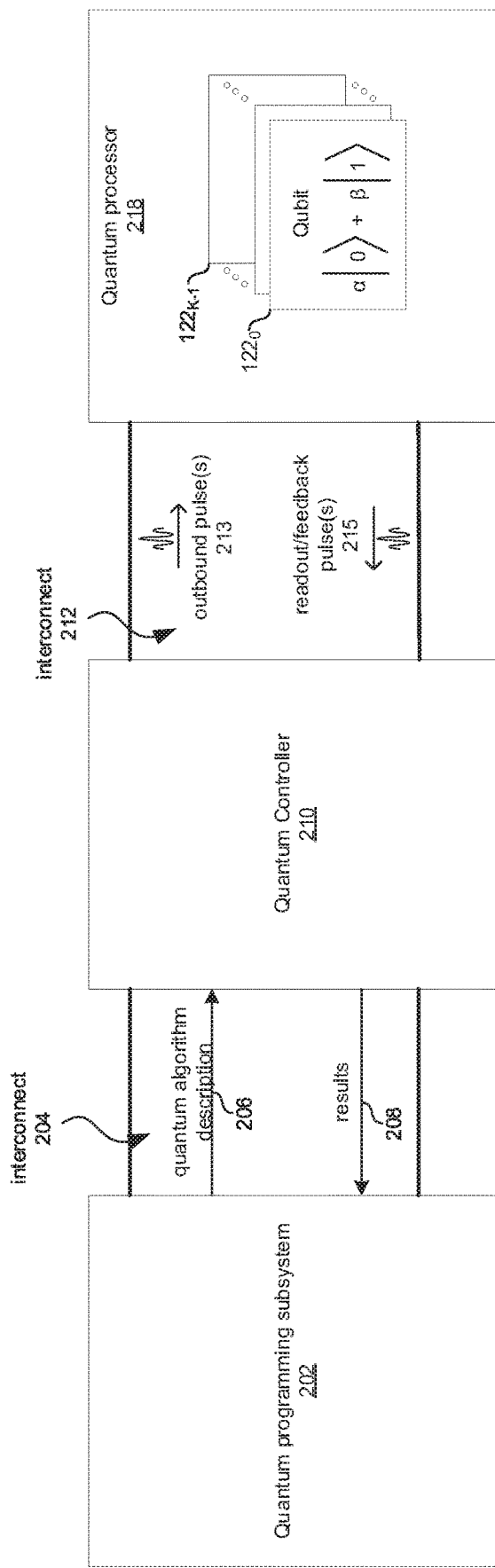
FIG. 2 shows an example quantum orchestration platform.

Classical computers operate by storing information in the form of binary digits ("bits") and processing those bits via binary logic gates. At any given time, each bit takes on only one of two discrete values: 0 (or "off") and 1 (or "on"). The logical operations performed by the binary logic gates are defined by Boolean algebra and circuit behavior is governed by classical physics. In a modern classical system, the circuits for storing the bits and realizing the logical operations are usually made from electrical wires that can carry two different voltages, representing the 0 and 1 of the bit, and transistor-based logic gates that perform the Boolean logic operations.

Shown in FIG. 1A is a simple example of a classical computer configured to a bit 102 and apply a single logic operation 104 to the bit 102. At time t0 the bit 102 is in a first state, at time t1 the logic operation 104 is applied to the bit 102, and at time t2 the bit 102 is in a second state determined by the state at time t0 and the logic operation. So, for example, the bit 102 may typically be stored as a voltage (e.g., 1 Vdc for a "1" or 0 Vdc for a "0") which is applied to an input of the logic operation 104 (comprised of one or more transistors). The output of the logic gate is then either 1 Vdc or 0 Vdc, depending on the logic operation performed.

Obviously, a classical computer with a single bit and single logic gate is of limited use, which is why modern classical computers with even modest computation power contain billions of bits and transistors. That is to say, classical computers that can solve increasingly complex problems inevitably require increasingly large numbers of bits and transistors and/or increasingly long amounts of time for carrying out the algorithms. There are, however, some problems which would require an infeasibly large number of transistors and/or infeasibly long amount of time to arrive at a solution. Such problems are referred to as intractable.

Quantum computers operate by storing information in the form of quantum bits ("qubits") and processing those qubits via quantum gates. Unlike a bit which can only be in one state (either 0 or 1) at any given time, a qubit can be in a superposition of the two states at the same time. More precisely, a quantum bit is a system whose state lives in a two dimensional Hilbert space and is therefore described as a linear combination $\alpha|0\rangle + \beta|1\rangle$, where $|0\rangle$ and $|1\rangle$ are two basis states, and $\alpha$ and $\beta$ are complex numbers, usually called probability amplitudes, which satisfy $|\alpha|^2+|\beta|^2=1$. Using this notation, when the qubit is measured, it will be 0 with probability $|\alpha|^2$ and will be 1 with probability $|\beta|^2$. $|0\rangle$ and $|1\rangle$ can also be represented by two-dimensional basis vectors $$\begin{bmatrix}1\\0\end{bmatrix} \text{ and } \begin{bmatrix}0\\1\end{bmatrix},$$

respectively, and then the qubit state is represented by $$\begin{bmatrix}\alpha\\\beta\end{bmatrix}.$$

The operations performed by the quantum gates are defined by linear algebra over Hilbert space and circuit behavior is governed by quantum physics. This extra richness in the mathematical behavior of qubits and the operations on them, enables quantum computers to solve some problems much faster than classical computers (in fact some problems that are intractable for classical computers may become trivial for quantum computers).

Shown in FIG. 1B is a simple example of a quantum computer configured to store a qubit 122 and apply a single quantum gate operation 124 to the qubit 122. At time t0 the qubit 122 is described by $\alpha_1|0\rangle + \beta_1|1\rangle$, at time t1 the logic operation 104 is applied to the qubit 122, and at time t2 the qubits 122 is described by $\alpha_2|0\rangle + \beta_2|1\rangle$.

Unlike a classical bit, a qubit cannot be stored as a single voltage value on a wire. Instead, a qubit is physically realized using a two-level quantum mechanical system. Many physical implementations of qubits have been proposed and developed over the years with some being more promising than others. Some examples of leading qubits implementations include superconducting circuits, spin qubits, and trapped ions.

It is the job of the quantum controller to generate the precise series of external signals, usually pulses of electromagnetic waves and pulses of base band voltage, to perform the desired logic operations (and thus carry out the desired quantum algorithm). Example implementations of a quantum controller are described in further detail below.

FIG. 2 shows an example quantum orchestration platform (QOP). The system comprises a quantum programming subsystem 202, a quantum controller 210, and a quantum processor 218.

The quantum programming subsystem 202 comprises circuitry operable to generate a quantum algorithm description 206 which configures the quantum controller 210 and includes instructions the quantum controller 210 can execute to carry out the quantum algorithm (i.e., generate the necessary outbound quantum control pulse(s) 213) with little or no human intervention during runtime. In an example implementation, the quantum programming system 202 is a personal computer comprising a processor, memory, and other associated circuitry (e.g., an x86 or x64 chipset) having installed on it a quantum orchestration software development kit (SDK) that enables creation (e.g., by a user via a text editor and/or by automated quantum algorithm description generation circuitry) of a high-level (as opposed to binary or "machine code") quantum algorithm description 206. In an example implementation, the high-level quantum algorithm description uses a high-level programming language (e.g., Python, R, Java, Matlab, etc.) simply as a "host" programming language in which are embedded the QOP programming constructs.

The high-level quantum algorithm description may comprise a specification and a program. Although the specification and program may be part of one or more larger databases and/or contained in one or more files, the remainder of this disclosure will, for simplicity of description, assume the configuration data structure and the program data structure each takes the form of a plain-text file recognizable by an operating system (e.g., windows, Linux, Mac, or another OS) on which quantum programming subsystem runs. The quantum programming subsystem 202 then compiles the high-level quantum algorithm description 206 to a machine code version of the quantum algorithm description 206 (i.e., series of binary vectors that represent instructions that the quantum controller's hardware can interpret and execute directly). An example implementation of the data structures/vectors used for realizing the machine code version of the quantum algorithm description are described below.

The quantum programming subsystem 202 is coupled to the quantum controller 210 via interconnect 204 which may, for example, utilize universal serial bus (USB), peripheral component interconnect (PCIe) bus, wired or wireless Ethernet, or any other suitable communication protocol. The quantum controller 210 comprises circuitry operable to load the machine code quantum algorithm description 206 from the programming subsystem 202 via interconnect 204. Then, execution of the machine code by the quantum controller 210 causes the quantum controller 210 to generate the necessary outbound quantum control pulse(s) 213 that correspond to the desired operations to be performed on the quantum processor 218 (e.g., sent to qubit(s) for manipulating a state of the qubit(s) or to readout resonator(s) for reading the state of the qubit(s), etc.). Depending on the quantum algorithm to be performed, outbound pulse(s) 213 for carrying out the algorithm may be predetermined at design time and/or may need to be determined during runtime. The runtime determination of the pulses may comprise performance of classical calculations and processing in the quantum controller 210 and/or the quantum programing subsystem 202 during runtime of the algorithm (e.g., runtime analysis of inbound pulses 215 received from the quantum processor 218).

During runtime and/or upon completion of a quantum algorithm performed by the quantum controller 210, the quantum controller 210 may output data/results 208 to the quantum programming subsystem 202. In an example implementation these results may be used to generate a new quantum algorithm description 206 for a subsequent run of the quantum algorithm and/or update the quantum algorithm description during runtime.

The quantum controller 210 is coupled to the quantum processor 218 via interconnect 212 which may comprise, for example, one or more conductors and/or optical fibers. The quantum controller 210 may comprise a plurality of interconnected, but physically distinct quantum control modules (e.g., each module being a desktop or rack mounted device) such that quantum control systems requiring relatively fewer resources can be realized with relatively fewer quantum control modules and quantum control systems requiring relatively more resources can be realized with relatively more quantum control modules. This enables a scalable quantum-computer-as-a-service architecture which can be hosted the cloud.

The quantum processor 218 comprises K (an integer) quantum elements 122, which includes qubits (which could be of any type such as superconducting, spin qubits, ion trapped, etc.), and, where applicable, any other element(s) for processing quantum information, storing quantum information (e.g. storage resonator), and/or coupling the outbound quantum control pulses 213 and inbound quantum control pulses 215 between interconnect 212 and the quantum element(s) 122 (e.g., readout resonator(s)). In an example implementation in which the quantum processor comprises readout resonators (or other readout circuitry), K may be equal to the total number of qubits plus the number of readout circuits. That is, if each of Q (an integer) qubits of the quantum processor 218 is associated with a dedicated readout circuit, then K may be equal to 2Q. For ease of description, the remainder of this disclosure will assume such an implementation, but it need not be the case in all implementations. Other elements of the quantum processor 218 may include, for example, flux lines (electronic lines for carrying current), gate electrodes (electrodes for voltage gating), current/voltage lines, amplifiers, classical logic circuits residing on-chip in the quantum processor 218, and/or the like.

Figure 3A:
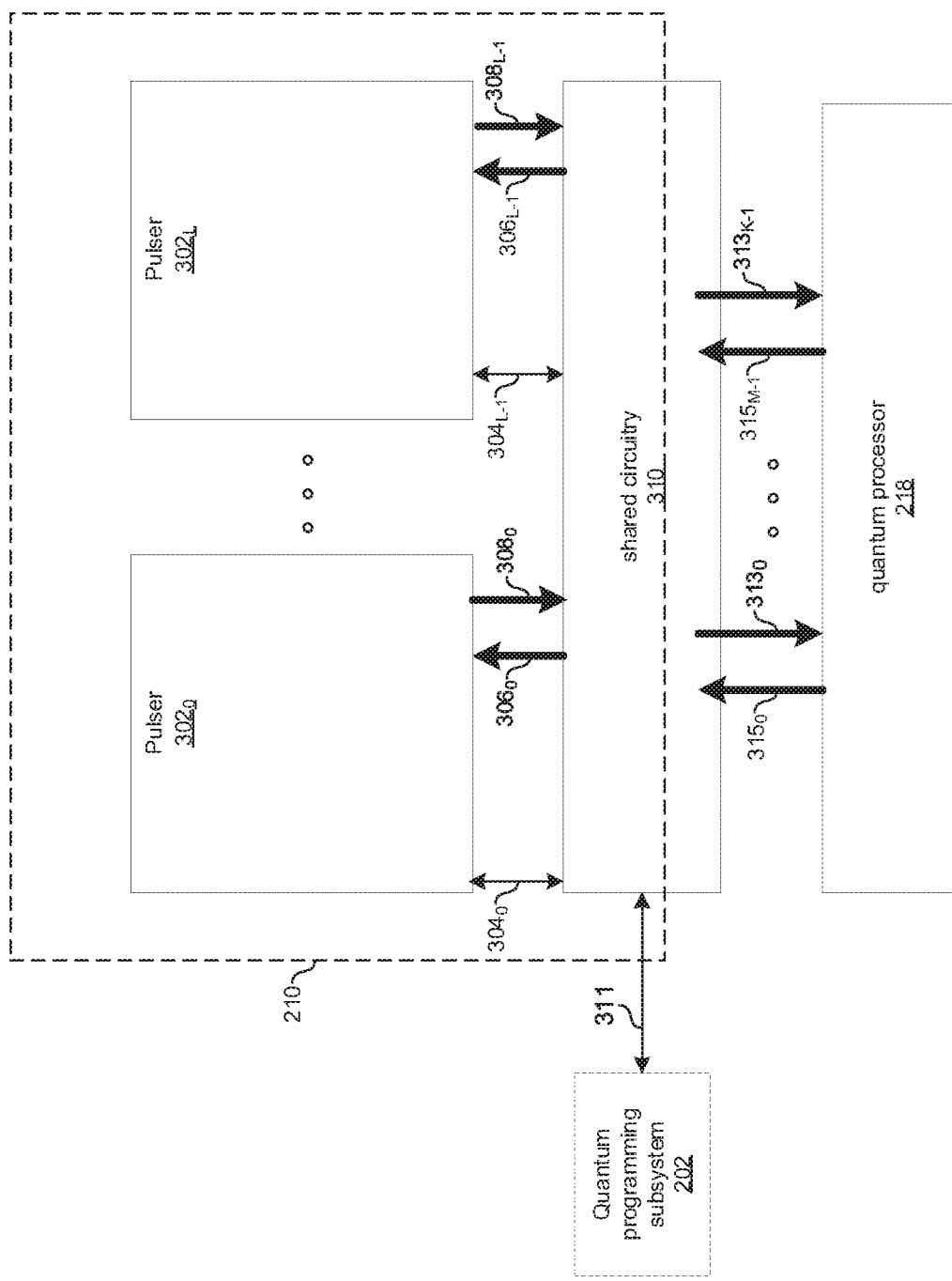
FIG. 3A shows an example quantum orchestration platform (QOP) architecture in accordance with various example implementations of this disclosure.

FIG. 3A shows an example quantum controller architecture in accordance with various example implementations of this disclosure. The quantum controller 210 comprises L (an integer ≥1) pulser circuits $302_0$-$302_{L-1}$ and shared circuitry 310.

In the example implementation shown, each pulser circuit $302_l$ (l an integer between 0 and L−1) comprises circuitry for exchanging information over signal paths $304_l$, $306_l$, and $308_l$, where the signal path $308_l$ carries outbound pulses (e.g., 213 of FIG. 2) generated by the pulser circuit $302_l$ (which may be, for example, control pulses sent to the quantum processor 218 to manipulate one or more properties of one or more quantum elements—e.g., manipulate a state of one or more qubits, manipulate a frequency of a qubit using flux biasing, etc., and/or readout a state of one or more quantum elements), the signal path $306_1$ carries inbound quantum element readout pulses (e.g., 215 of FIG. 2) to be processed by the pulser circuit $302_1$, and signal path $304_1$ carries control information. Each signal path may comprise one or more conductors, optical channels, and/or wireless channels.

Each pulser circuit $302_1$ comprises circuitry operable to generate outbound pulses on signal path $308_1$ according to quantum control operations to be performed on the quantum processor 218. This involves very precisely controlling characteristics such as phase, frequency, amplitude, and timing of the outbound pulses. The characteristics of an outbound pulse generated at any particular time may be determined, at least in part, on inbound pulses received from the quantum processor 218 (via shared circuitry 310 and signal path $306_1$) at a prior time. In an example implementation, the time required to close the feedback loop (i.e., time from receiving a first pulse on one or more of paths $315_1$-$315_L$ (e.g., at an analog to digital converter of the path) to sending a second pulse on one or more of paths $313_0$-$313_{L-1}$ (e.g., at an output of a digital-to-analog converter of the path), where the second pulse is based on the first pulse, is significantly less than the coherence time of the qubits of the quantum processor 218. For example, the time to close the feedback loop may be on the order of 100 nanoseconds. It should be noted that each signal path in FIG. 3A may in practice be a set of signal paths for supporting generation of multi-pulse sets (e.g., two signal paths for two-pulse pairs, three signal paths for three-pulse sets, and so on).

In the example implementation shown, the shared circuitry 310 comprises circuitry for exchanging information with the pulser circuits $302_0$-$302_{L-1}$ over signal paths $304_0$-$304_{L-1}$, $306_0$-$306_{L-1}$, and $308_0$-$308_{L-1}$, where each signal path $308_1$ carries outbound pulses generated by the pulser circuit $302_1$, each signal path $306_1$ carries inbound pulses to be processed by pulser circuit $302_1$, and each signal path $304_1$ carries control information such as flag/status signals, data read from memory, data to be stored in memory, data streamed to/from the quantum programming subsystem 202, and data to be exchanged between two or more pulsers $302_0$-$302_L$. Similarly, in the example shown the shared circuitry 310 comprises circuitry for exchanging information with the quantum processor 218 over signal paths $315_0$-$315_{M-1}$ and $313_1$-$313_{K-1}$, where each signal path $315_m$ (m an integer between 0 and M−1) carries inbound pulses from the quantum processor 218, and each signal path $313_k$ (k an integer between 0 and K−1) carries outbound pulses to the quantum processor 218. Additionally, in the example shown the shared circuitry 310 comprises circuitry for exchanging information with the quantum programming subsystem over signal path 311. The shared circuitry 310 may be: integrated with the quantum controller 210 (e.g., residing on one or more of the same field programmable gate arrays or application specific integrated circuits or printed circuit boards); external to the quantum controller (e.g., on a separate FPGA, ASIC, or PCB connected to the quantum controller via one or more cables, backplanes, or other devices connected to the quantum processor 218, etc.); or partially integrated with the quantum controller 210 and partially external to the quantum controller 210.

In various implementations, M may be less than, equal to, or greater than L, K may be less than, equal to, or greater than L, and M may be less than, equal to, or greater than K. For example, the nature of some quantum algorithms is such that not all K quantum elements need to be driven at the same time. For such algorithms, L may be less than K and one or more of the L pulsers $302_1$ may be shared among multiple of the K quantum elements circuits. That is, any pulser $302_1$ may generate pulses for different quantum elements at different times. This ability of a pulser $302_1$ to generate pulses for different quantum elements at different times can reduce the number of pulsers $302_0$-$302_{L-1}$ (i.e., reduce L) required to support a given number of quantum elements (thus saving significant resources, cost, size, overhead when scaling to larger numbers of qubits, etc.).

The ability of a pulser $302_1$ to generate pulses for different quantum elements at different times also enables reduced latency. As just one example, assume a quantum algorithm which needs to send a pulse to quantum element $122_0$ at time T1, but whether the pulse is to be of a first type or second type (e.g., either an X pulse or a Hadamard pulse) cannot be determined until after processing an inbound readout pulse at time T1-DT (i.e., DT time intervals before the pulse is to be output). If there were a fixed assignment of pulsers $302_0$-$302_{L-1}$ to quantum elements of the quantum processor 218 (i.e., if $302_0$ could only send pulses to quantum element $122_0$, and $302_1$ could only send pulses to quantum element $122_1$, and so on), then pulser $302_0$ might not be able to start generating the pulse until it determined what the type was to be. In the depicted example implementation, on the other hand, pulser $302_0$ can start generating the first type pulse and pulser $302_1$ can start generating the second type pulse and then either of the two pulses can be released as soon as the necessary type is determined. Thus, if the time to generate the pulse is $T_{lat}$, in this example the example quantum controller 210 may reduce latency of outputting the pulse by $T_{lat}$.

The shared circuitry 310 is thus operable to receive pulses via any one or more of the signals paths $308_0$-$308_{L-1}$ and/or $315_0$-$315_{M-1}$, process the received pulses as necessary for carrying out a quantum algorithm, and then output the resulting processed pulses via any one or more of the signal paths $306_0$-$306_{L-1}$ and/or $313_0$-$313_{K-1}$. The processing of the pulses may take place in the digital domain and/or the analog domain. The processing may comprise, for example: frequency translation/modulation, phase translation/modulation, frequency and/or time division multiplexing, time and/or frequency division demultiplexing, amplification, attenuation, filtering in the frequency domain and/or time domain, time-to-frequency-domain or frequency-to-time-domain conversion, upsampling, downsampling, and/or any other signal processing operation. At any given time, the decision as to from which signal path(s) to receive one or more pulse(s), and the decision as to onto which signal path(s) to output the pulse(s) may be: predetermined (at least in part) in the quantum algorithm description; and/or dynamically determined (at least in part) during runtime of the quantum algorithm based on classical programs/computations performed during runtime, which may involve processing of inbound pulses. As an example of predetermined pulse generation and routing, a quantum algorithm description may simply specify that a particular pulse with predetermined characteristics is to be sent to signal path $313_1$ at a predetermined time. As an example of dynamic pulse determination and routing, a quantum algorithm description may specify that an inbound readout pulse at time T-DT should be analyzed and its characteristics (e.g., phase, frequency, and/or amplitude) used to determine, for example, whether at time T pulser $302_1$ should output a pulse to a first quantum element or to a second quantum element or to determine, for example, whether at time T pulser $302_1$ should output a first pulse to a first quantum element or a second pulse to the first quantum element. In various implementations of the quantum controller 210, the shared circuitry 310 may perform various other functions instead of and/or in addition to those described above. In general, the shared circuitry 310 may perform functions that are desired to be performed outside of the individual pulser circuits $302_0$-$302_{L-1}$. For example, a function may be desirable to implement in the shared circuitry 310 where the same function is needed by a number of pulser circuits from $302_0$-$302_{L-1}$ and thus may be shared among these pulser circuits instead of redundantly being implemented inside each pulser circuit. As another example, a function may be desirable to implement in the shared circuitry 310 where the function is not needed by all pulser circuits $302_0$-$302_{L-1}$ at the same time and/or on the same frequency and thus fewer than L circuits for implementing the function may be shared among the L pulser circuits $302_0$-$302_{L-1}$ through time and/or frequency division multiplexing. As another example, a function may be desirable to implement in the shared circuitry 310 where the function involves making decisions based on inputs, outputs, and/or state of multiple of the L pulser circuits $302_0$-$302_{L-1}$, or other circuits. Utilizing a centralized coordinator/decision maker in the shared circuitry 310 may have the benefit(s) of: (1) reducing pinout and complexity of the pulser circuits $302_0$-$302_{L-1}$; and/or (2) reducing decision-making latency. Nevertheless, in some implementations, decisions affecting multiple pulser circuits $302_0$-$302_{L-1}$ may be made by one or more of the pulser circuits $302_0$-$302_{L-1}$ where the information necessary for making the decision can be communicated among pulser circuits within a suitable time frame (e.g., still allowing the feedback loop to be closed within the qubit coherence time) over a tolerable number of pins/traces.

Figure 3B:
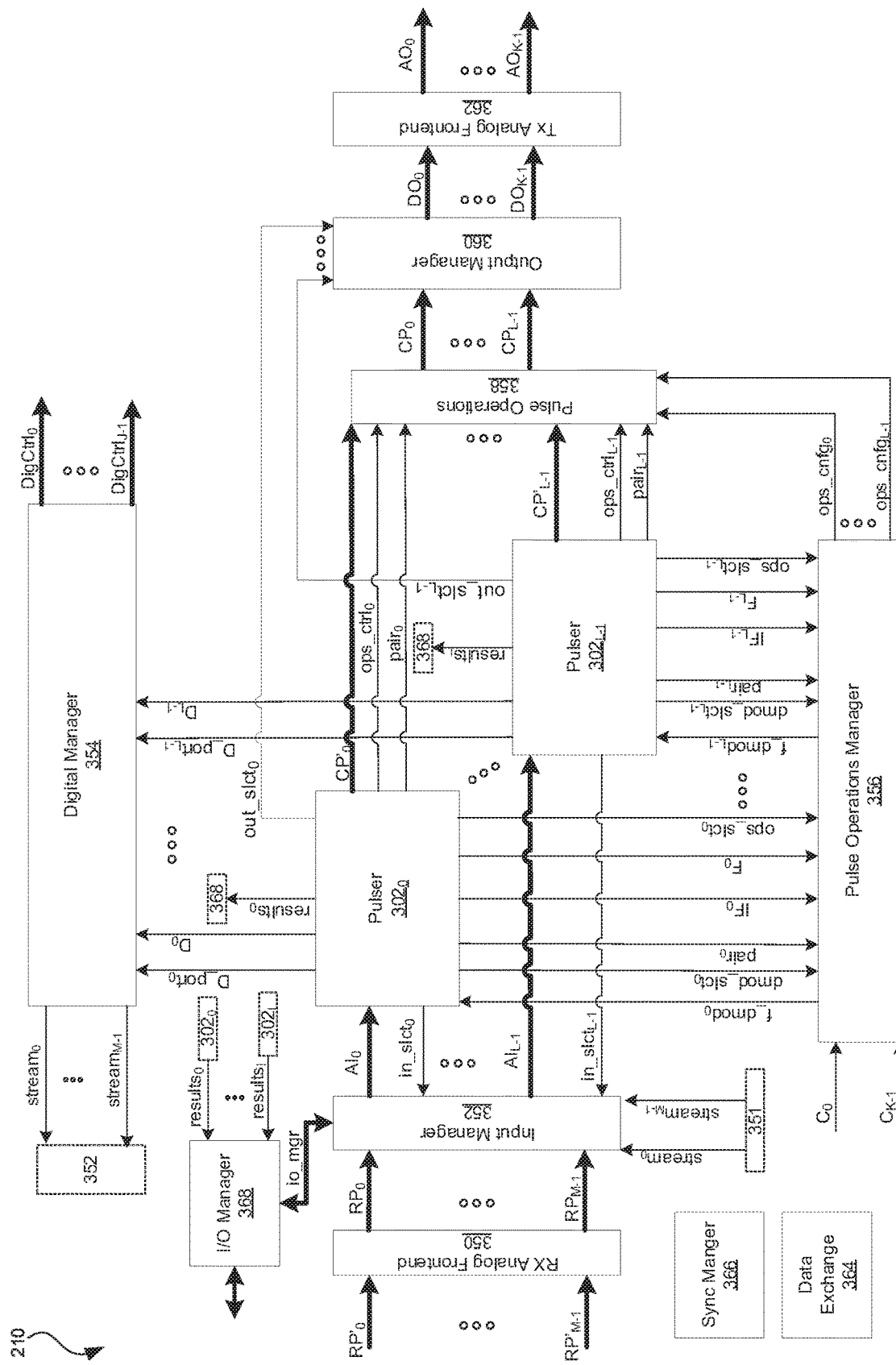
FIG. 3B shows an example implementation of the quantum controller circuitry of FIG. 3A.

FIG. 3B shows an example implementation of the quantum controller of FIG. 2. The example quantum controller shown comprises pulsers $302_1$-$302_{L-1}$, receive analog frontend 350, input manager 352, digital manager 354, pulse operations manager 356, pulse operations 358, output manager 360, transmit analog frontend 362, data exchange 364, synchronization manager 366, and input/output ("I/O") manager 368. Circuitry depicted in FIG. 3B other than pulser circuits $302_0$-$302_{L-1}$ corresponds to an example implementation of the shared circuitry 310 of FIG. 3A.

The receive analog frontend 350 comprises circuitry operable to concurrently process up to M (an integer ≥1) analog inbound signals (RP'$_0$-RP'$_{M-1}$) received via signal paths $315_0$-$315_{M-1}$ to generate up to M concurrent inbound signals (RP$_0$-RP$_{M-1}$) to be output to input manager 352 via one or more signal paths. Although there is shown to be M signals RP and M signals RP', this need not be the case. Such processing may comprise, for example, analog-to-digital conversion, filtering, upconversion, downconversion, amplification, attenuation, time division multiplexing/demultiplexing, frequency division multiplexing/demultiplexing, and/or the like. In various implementations, M may be less than, equal to, or greater than L and M may be less than, equal to, or greater than K.

The input manager 352 comprises circuitry operable to route any one or more of signals (RP$_0$-RP$_{M-1}$) to any one or more of pulsers $302_0$-$302_{L-1}$ (as signal(s) Al$_0$-Al$_{L-1}$) and/or to other circuits (e.g. as signal io_mgr to I/O manager 368). In an example implementation, the input manager 352 comprises one or more switch networks, multiplexers, and/or the like for dynamically reconfiguring which signals RP$_0$-RP$_{M-1}$ are routed to which pulsers $302_0$-$302_{L-1}$. This may enable time division multiplexing multiple of the signals RP$_0$-RP$_{M-1}$ onto a single signal Al$_1$ and/or time division demultiplexing components (e.g., time slices) of a signal RP$_m$ onto multiple of the signals Al$_0$-Al$_{L-1}$. In an example implementation, the input manager 352 comprises one or more mixers and/or filters for frequency division multiplexing multiple of the signals RP$_0$-RP$_{M-1}$ onto a single signal Al$_1$ and/or frequency division demultiplexing components (e.g., frequency bands) of a signal RP$_m$ onto multiple of the signals Al$_0$-Al$_{L-1}$. The signal routing and multiplexing/demultiplexing functions performed by the input manager 352 enables: a particular pulser $302_1$ to process different inbound pulses from different quantum elements at different times; a particular pulser $302_1$ to process different inbound pulses from different quantum elements at the same time; and multiple of the pulsers $302_0$-$302_{L-1}$ to processes the same inbound pulse at the same time. In the example implementation shown, routing of the signals RP$_0$-RP$_{M-1}$ among the inputs of the pulsers $302_0$-$302_{L-1}$ is controlled by digital control signals in_slct$_0$-in_slct$_{L-1}$ from the pulsers $302_0$-$302_{L-1}$. In another implementation, the input manager may be operable to autonomously determine the appropriate routing (e.g., where the quantum algorithm description includes instructions to be loaded into memory of, and executed by, the input manager 352). In the example implementation, the input manager 352 is operable to rout input signals RP$_0$-RP$_{M-1}$ to the I/O manager 368 (as signal(s) io_mgr), to be sent to the quantum programing subsystem 202. This routing may, for example, be controlled by signals from the digital manager 354. In an example implementation, for each input signal RP$_m$ there is a digital signal, stream$_m$, from the digital manager 354 to the input manager 352 that controls whether RP$_m$ will be sent from the input manager 352 to the I/O manager 368 and from there to the quantum programing subsystem 202.

Each of the pulsers $302_0$-$302_{L-1}$ is as described above with reference to FIG. 3A. In the example implementation shown, each pulser $302_1$ is operable to generate raw outbound pulses CP'$_1$ ("raw" is used simply to denote that the pulse has not yet been processed by pulse operations circuitry 358) and digital control signals in_slct$_1$, D_port$_1$, D$_1$, out_slct$_1$, ops_ctrl$_1$, ops_slct$_1$, IF$_1$, F$_1$, and dmod_sclt$_1$ for carrying out quantum algorithms on the quantum processor 218, and results for carrying intermediate and/or final results generated by the pulser $302_1$ to the quantum programming subsystem 202. One or more of the pulsers $302_0$-$302_{L-1}$ may receive and/or generate additional signals which are not shown in FIG. 3A for clarity of illustration. The raw outbound pulses CP'$_0$-CP'$_{L-1}$ are conveyed via signal paths $308_0$-$308_{L-1}$ and the digital control signals are conveyed via signal paths $304_0$-$304_{L-1}$. Each of the pulsers $302_1$ is operable to receive inbound pulse signal Al$_1$ and signal f_dmod$_1$. Pulser $302_1$ may process the inbound signal Al$_1$ to determine the state of certain quantum element(s) in the quantum processor 218 and use this state information for making decisions such as, for example, which raw outbound pulse CP'$_1$ to generate next, when to generate it, and what control signals to generate to affect the characteristics of that raw outbound pulse appropriately. Pulser $302_1$ may use the signal f_dmod$_1$ for determining how to process inbound pulse signal Al$_1$. As an example, when pulser $302_1$ needs to process an inbound signal Al$_1$ from quantum element $122_3$, it can send a dmod_sclt$_1$ signal that directs pulse operations manager 356 to send, on f_dmod$_1$, settings to be used for demodulation of an inbound signal Al$_1$ from quantum element $122_3$ (e.g., the pulse operations manager 356 may send the value $\cos(\omega_3 * TS * T_{clk1} + \phi_3)$, where $\omega_3$ is the frequency of quantum element $122_3$, TS is amount of time passed since the reference point, for instance the time at which quantum algorithm started running, and $\phi_3$ is the phase of the total frame rotation of quantum element $122_3$, i.e. the accumulated phase of all frame rotations since the reference point).

The pulse operations circuitry 358 is operable to process the raw outbound pulses $CP'_0$-$CP'_{L-1}$ to generate corresponding output outbound pulses $CP_0$-$CP_{L-1}$. This may comprise, for example, manipulating the amplitude, phase, and/or frequency of the raw pulse $CP'_1$. The pulse operations circuitry 358 receives raw outbound pulses $CP'_0$-$CP'_{L-1}$ from pulsers $302_0$-$302_{L-1}$, control signals ops_cnfg$_0$-ops_cnfg$_{L-1}$ from pulse operations manager 356, and ops_ctrl$_0$-ops_ctrl$_{L-1}$ from pulsers $302_0$-$302_{L-1}$.

The control signal ops_cnfg$_1$ configures, at least in part, the pulse operations circuitry 358 such that each raw outbound pulse $CP'_1$ that passes through the pulse operations circuitry 358 has performed on it one or more operation(s) tailored for that particular pulse. To illustrate, denoting a raw outbound pulse from pulser 3023 at time T1 as $CP'_{3,T1}$, then, at time T1 (or sometime before T1 to allow for latency, circuit setup, etc.), the digital control signal ops_cnfg$_3$ (denoted ops_cnfg$_{3,T1}$ for purposes of this example) provides the information (e.g., in the form of one or more matrix, as described below) as to what specific operations are to be performed on pulse $CP'_{3,T1}$. Similarly, ops_cnfg$_{4,T1}$ provides the information as to what specific operations are to be performed on pulse $CP'_{4,T1}$, and ops_cnfg$_{3,T2}$ provides the information as to what specific operations are to be performed on pulse $CP'_{4,T1}$.

The control signal ops_ctrl$_1$ provides another way for the pulser $302_1$ to configure how any particular pulse is processed in the pulse operations circuitry 358. This may enable the pulser $302_1$ to, for example, provide information to the pulse operation circuitry 358 that does not need to pass through the pulse operation manager 356. For example, the pulser $302_1$ may send matrix values calculated in real-time by the pulser $302_1$ to be used by the pulse operation circuitry 358 to modify pulse CP'. These matrix values arrive to the pulse operation circuitry 358 directly from the pulser $302_1$ and do not need to be sent to the pulse operation manager first. Another example may be that the pulser $302_1$ provides information to the pulse operation circuitry 358 to affect the operations themselves (e.g. the signal ops_ctrl$_1$ can choose among several different mathematical operations that can be performed on the pulse).

The pulse operations manager 356 comprises circuitry operable to configure the pulse operations circuitry 358 such that the pulse operations applied to each raw outbound pulse CP' are tailored to that particular raw outbound pulse. To illustrate, denoting a first raw outbound pulse to be output during a first time interval T1 as $CP'_{1,T1}$, and a second raw outbound pulse to be output during a second time interval T2 as $CP'_{1,T2}$, then pulse operations circuitry 358 is operable to perform a first one or more operations on $CP'_{1,T1}$ and a second one or more operations on $CP'_{1,T2}$. The first one or more operations may be determined, at least in part, based on to which quantum element the pulse $CP_{1,T1}$ is to be sent, and the second one or more operations may be determined, at least in part, based on to which quantum element the pulse $CP_{1,T2}$ is to be sent. The determination of the first one or more operations and second one or more operations may be performed dynamically during runtime.

The transmit analog frontend 362 comprises circuitry operable to concurrently process up to K digital signals $DO_k$ to generate up to K concurrent analog signals $AO_k$ to be output to the quantum processor 218. Such processing may comprise, for example, digital-to-analog conversion, filtering, upconversion, downconversion, amplification, attenuation, time division multiplexing/demultiplexing, frequency division multiplexing/demultiplexing and/or the like. In an example implementation, each of the one or more of signal paths $313_0$-$313_{K-1}$ (FIG. 3A) represents a respective portion of Tx analog frontend circuit 362 as well as a respective portion of interconnect 212 (FIG. 2) between the Tx analog frontend circuit 362 and the quantum processor 218. Although there is one-to-one correspondence between the number of DO signals and the number of AO signals in the example implementation described here, such does not need to be the case. In another example implementation, the analog frontend 362 is operable to map more (or fewer) signals DO to fewer (or more) signals AO. In an example implementation the transmit analog frontend 362 is operable to process digital signals $DO_0$-$DO_{K-1}$ as K independent outbound pulses, as K/2 two-pulse pairs, or process some of signals $DO_0$-$DO_{K-1}$ as independent outbound pulses and some signals $DO_0$-$DO_{K-1}$ as two-pulse pairs (at different times and/or concurrently).

The output manager 360 comprises circuitry operable to route any one or more of signals $CP_0$-$CP_{L-1}$ to any one or more of signal paths $313_0$-$313_{K-1}$. As just one possible example, signal path $313_0$ may comprise a first path through the analog frontend 362 (e.g., a first mixer and DAC) that outputs $AO_0$ and traces/wires of interconnect 212 that carry signal $AO_0$; signal path $313_1$ may comprise a second path through the analog frontend 362 (e.g., a second mixer and DAC) that outputs $AO_1$ and traces/wires of interconnect 212 that carry signal $AO_1$, and so on. In an example implementation, the output manager 360 comprises one or more switch networks, multiplexers, and/or the like for dynamically reconfiguring which one or more signals $CP_0$-$CP_{L-1}$ are routed to which signal paths $313_0$-$313_{K-1}$. This may enable time division multiplexing multiple of the signals $CP_0$-$CP_{L-1}$ onto a single signal path $313_k$ and/or time division demultiplexing components (e.g., time slices) of a signal $CP_m$ onto multiple of the signal paths $313_0$-$313_{K-1}$. In an example implementation, the output manager 360 comprises one or more mixers and/or filters for frequency division multiplexing multiple of the signals $CP_0$-$CP_{M-1}$ onto a single signal path $313_k$ and/or frequency division demultiplexing components (e.g., frequency bands) of a signal $CP_m$ onto multiple of the signal paths $313_0$-$313_{K-1}$. The signal routing and multiplexing/demultiplexing functions performed by the output manager 360 enables: routing outbound pulses from a particular pulser $302_1$ to different ones of the signal paths $313_0$-$313_{K-1}$ at different times; routing outbound pulses from a particular pulser $302_1$ to multiple of the signal paths $313_0$-$313_{K-1}$ at the same time; and multiple of the pulsers $302_0$-$302_{L-1}$ generating pulses for the same signal path $313_k$ at the same time. In the example implementation shown, routing of the signals $CP_0$-$CP_{L-1}$ among the signal paths $313_0$-$313_{K-1}$ is controlled by digital control signals out_slct$_0$-out_slct$_{L-1}$ from the pulsers $302_0$-$302_{L-1}$. In another implementation, the output manager 360 may be operable to autonomously determine the appropriate routing (e.g., where the quantum algorithm description includes instructions to be loaded into memory of, and executed by, the output manager 360). In an example implementation, at any given time, the output manager 360 is operable to concurrently route K of the digital signals $CP_0$-$CP_{L-1}$ as K independent outbound pulses, concurrently route K/2 of the digital signals $CP_0$-$CP_{L-1}$ as two-pulse pairs, or route some of signals $CP_0$-$CP_{L-1}$ as independent outbound pulses and some others of the signals $CP_0$-$CP_{L-1}$ as multi-pulse sets (at different times and/or concurrently).

The digital manager 354 comprises circuitry operable to process and/or route digital control signals ($DigCtrl_0$-$DigCtrl_{J-1}$) to various circuits of the quantum controller 210 and/or external circuits coupled to the quantum controller 210. In the example implementation shown, the digital manager receives, from each pulser $302_1$, (e.g., via one or more of signal paths $304_0$-$304_{N-1}$) a digital signal $D_1$ that is to be processed and routed by the digital manager 354, and a control signal $D\_port_1$ that indicates to which output port(s) of the digital manager 354 the signal $D_1$ should be routed. The digital control signals may be routed to, for example, any one or more of circuits shown in FIG. 3B, switches/gates which connect and disconnect the outputs $AO_0$-$AO_{K-1}$ from the quantum processor 218, external circuits coupled to the quantum controller 210 such as microwave mixers and amplifiers, and/or any other circuitry which can benefit from on real-time information from the pulser circuits $302_0$-$302_{L-1}$. Each such destination of the digital signals may require different operations to be performed on the digital signal (such as delay, broadening, or digital convolution with a given digital pattern). These operations may be performed by the digital manager 354 and may be specified by control signals from the pulsers $302_0$-$302_{L-1}$. This allows each pulser $302_1$ to generate digital signals to different destinations and allows different ones of pulsers $302_0$-$302_{L-1}$ to generate digital signals to the same destination while saving resources.

The synchronization manager 366 comprises circuitry operable to manage synchronization of the various circuits shown in FIG. 3B. Such synchronization is advantageous in a modular and dynamic system, such as quantum controller 210, where different ones of pulsers $302_0$-$302_{L-1}$ generate, receive, and process pulses to and from different quantum elements at different times. For example, while carrying out a quantum algorithm, a first pulser circuit $302_1$ and a second pulser circuit $302_2$ may sometimes need to transmit pulses at precisely the same time and at other times transmit pulses independently of one another. In the example implementation shown, the synchronization manager 366 reduces the overhead involved in performing such synchronization.

The data exchange circuitry 364 is operable to manage exchange of data among the various circuits shown in FIG. 3B. For example, while carrying out a quantum algorithm, a first pulser circuit $302_1$ and a second pulser circuit $302_2$ may sometimes need to exchange information. As just one example, pulser $302_1$ may need to share, with pulser $302_2$, the characteristics of an inbound signal $Al_1$ that it just processed so that pulser $302_2$ can generate a raw outbound pulse $CP'_2$ based on the characteristics of $Al_1$. The data exchange circuitry 364 may enable such information exchange. In an example implementation, the data exchange circuitry 364 may comprise one or more registers to and from which the pulsers $302_0$-$302_{L-1}$ can read and write.

The I/O manager 368 is operable to route information between the quantum controller 210 and the quantum programming subsystem 202. Machine code quantum algorithm descriptions may be received via the I/O manager 368. Accordingly, the I/O manager 368 may comprise circuitry for loading the machine code into the necessary registers/memory (including any SRAM, DRAM, flash memory, programmable read only memory, etc.) of the quantum controller 210 as well as for reading contents of the registers/memory of the quantum controller 210 and conveying the contents to the quantum programming subsystem 202.

Figure 4:
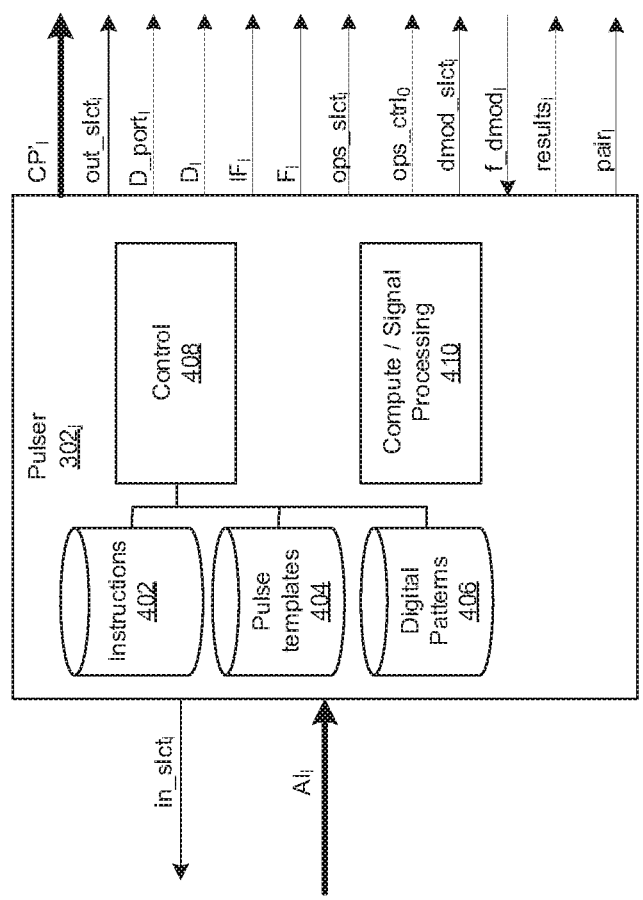
FIG. 4 shows an example implementation of the pulser of FIG. 3B.

FIG. 4 shows an example implementation of the pulser of FIG. 3B. The example pulser $302_1$ shown comprises instruction memory 402, pulse template memory 404, digital pattern memory 406, control circuitry 408, and compute and/or signal processing circuitry (CSP) 410.

The memories 402, 404, 406 may comprise one or more be any type of suitable storage elements (e.g., DRAM, SRAM, Flash, etc.). The instructions stored in memory 402 are instructions to be executed out by the pulser $302_1$ for carrying out its role in a quantum algorithm. Because different pulsers $302_0$-$302_{L-1}$ have different roles to play in any particular quantum algorithm (e.g., generating different pulses at different times), the instructions memory 402 for each pulser $302_1$ may be specific to that pulser. For example, the quantum algorithm description 206 from the quantum programming subsystem 202 may comprise a first set of instructions to be loaded (via I/O manager 368) into pulser $302_0$, a second set of instructions to be loaded into pulser $302_1$, and so on. Each pulse template stored in memory 404 comprises a sequence of one or more samples of any arbitrary shape (e.g., Gaussian, sinc, impulse, etc.) representing the pulses to be sent to pulse operation circuitry 358. Each digital pattern stored in memory 406 comprises a sequence of one or more binary values which may represent the digital pulses to be sent to the digital manager 354 for generating digital control signals $DigCtrl_0$-$DigCtrl_{J-1}$.

The control circuitry 408 is operable to execute the instructions stored in memory 402 to process inbound signal $Al_1$, generate raw outbound pulses $CP'_1$, and generate digital control signals $in\_slct_1$, $out\_slct_1$, $D\_port_1$, $D_1$, $IF_1$, $F_1$, $ops\_slct_1$, $ops\_ctrl_1$, $results_1$, $dmod\_slct_1$ and $pair_1$. In the example implementation shown, the processing of the inbound signal $Al_1$ is performed by the CSP circuitry 410 and based (at least in part) on the signal $f\_dmod_1$.

The compute and/or signal processing circuitry (CSP) 410 is operable to perform computational and/or signal processing functions, which may comprise, for example Boolean-algebra based logic and arithmetic functions and demodulation (e.g., of inbound signals $Al_1$). The CSP 410 may comprise memory in which are stored instructions for performing the functions and demodulation. The instructions may be specific to a quantum algorithm to be performed and be generated during compilation of a quantum machine specification and QUA program. An example implementation of the CSP 410 is described below with reference to FIGS. 10A and 10B.

In operation of an example implementation, generation of a raw outbound pulse $CP'_1$ comprises the control circuitry 408: (1) determining a pulse template to retrieve from memory 404 (e.g., based on a result of computations and/or signal processing performed by the CSP 410); (2) retrieving the pulse template; (3) performing some preliminary processing on the pulse template; (4) determining the values of F, IF, $pair_1$, $ops\_slct_1$, and $dmod\_slct_1$ to be sent to the pulse operation manager 356 (as predetermined in the quantum algorithm description and/or determined dynamically based on results of computations and/or signal processing performed by the CSP 410); (5) determining the value of $ops\_ctrl_1$ to be sent to the pulse operation circuitry 358; (6) determining the value of $in\_slct_1$ to be sent to the input manager 352; (7) determining a digital pattern to retrieve from memory 406 (as predetermined in the quantum algorithm description and/or determined dynamically based on results of computations and/or signal processing performed by the CSP 410); (8) outputting the digital pattern as $D_1$ to the digital manager along with control signal $D\_port_1$ (as predetermined in the quantum algorithm description and/or determined dynamically based on results of computations and/or signal processing performed by the CSP 410); (9) outputting the raw outbound pulse CP' to the pulse operations circuitry 358; (10) outputting results to the I/O manager.

Figure 5:
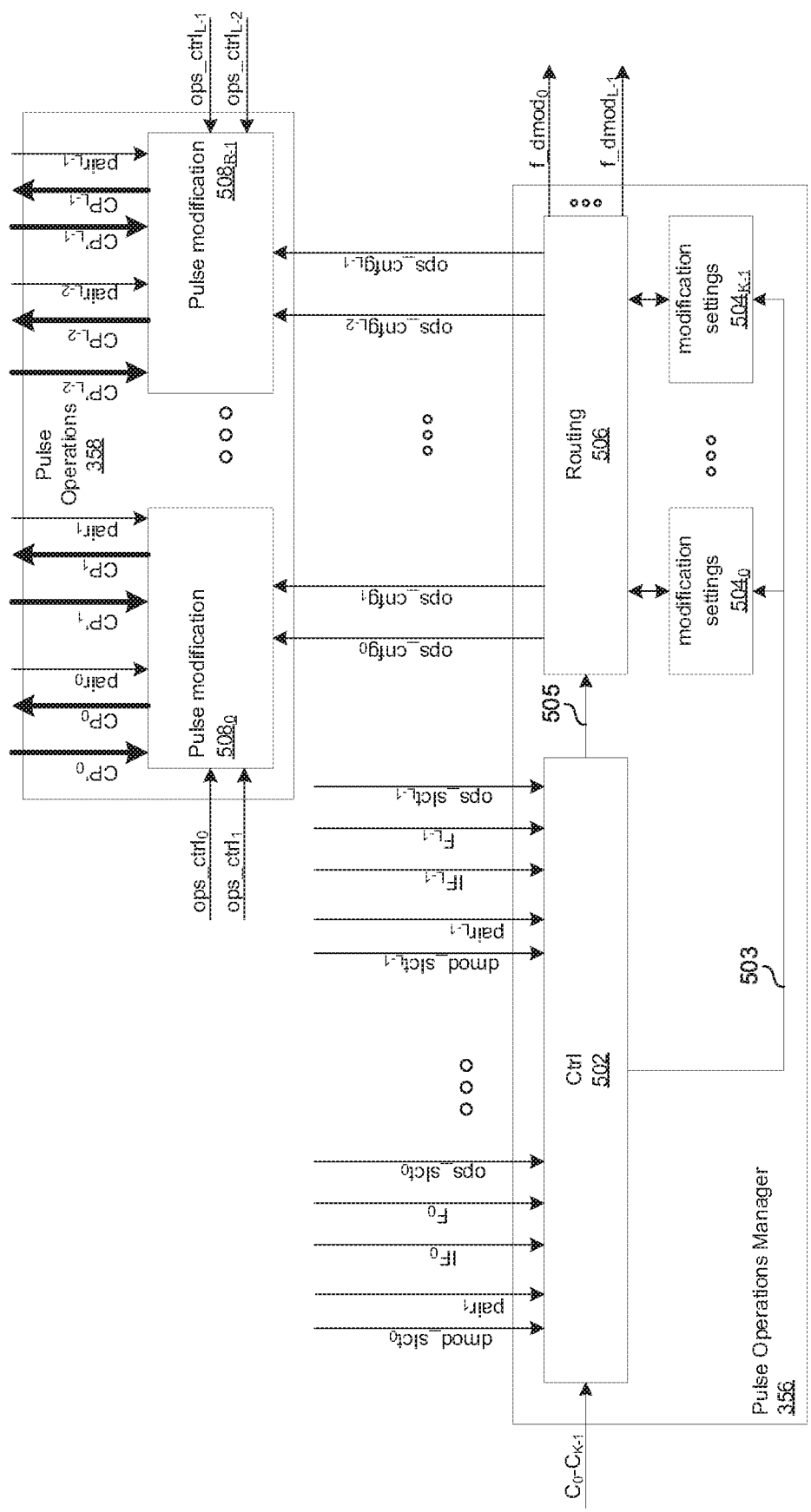
FIG. 5 shows an example implementation of the pulse operations manager and pulse operations circuitry of FIG. 3B.

FIG. 5 shows an example implementation of the pulse operations manager and pulse operations circuitry of FIG. 3B. The pulse operations circuitry 358 comprises a plurality of pulse modification circuits $508_0$-$508_{R-1}$ (R is an integer ≥1 in general, and R=L/2 in the example shown). The pulse operations manager 356 comprises control circuitry 502, routing circuitry 506, and a plurality of modification settings circuits $504_0$-$504_{K-1}$.

Although the example implementation has a 1-to-2 correspondence between pulse modification circuits $508_0$-$508_{R-1}$ and pulser circuits $302_0$-$302_{L-1}$, such does not need to be the case. In other implementations there may be fewer pulse modification circuits 508 than pulser circuits 302. Similarly, other implementations may comprise more pulse modification circuits 508 than pulser circuits 302.

As an example, in some instances, two of the pulsers $302_0$-$302_{L-1}$ may generate two raw outbound pulses which are a phase-quadrature pulse pair. For example, assuming $CP_1$ and $CP_2$ are a phase-quadrature pulse pair to be output on path 3133. In this example, pulse operations circuitry 358 may process $CP_1$ and $CP_2$ by multiplying a vector representation of CP'1 and CP'2 by one or more 2 by 2 matrices to: (1) perform single-sideband-modulation, as given by $$\begin{pmatrix} CP_1 \\ CP_2 \end{pmatrix} = \begin{pmatrix} \cos(\omega * TS * T_{clck1}) & -\sin(\omega * TS * T_{clck1}) \\ \sin(\omega * TS * T_{clck1}) & \cos(\omega * TS * T_{clck1}) \end{pmatrix} \begin{pmatrix} CP'_1 \\ CP'_2 \end{pmatrix},$$

where ω is the frequency of the single side band modulation and TS is the time passed since the reference time (e.g. the beginning of a certain control protocol); (2) keep track of frame-of-reference rotations, as given by $$\begin{pmatrix} CP_1 \\ CP_2 \end{pmatrix} = \begin{pmatrix} \cos(\phi) & -\sin(\phi) \\ \sin(\phi) & \cos(\phi) \end{pmatrix} \begin{pmatrix} CP'_1 \\ CP'_2 \end{pmatrix},$$

where ϕ is the total phase that the frame of reference accumulated since the reference time; and/or (3) perform an IQ-mixer correction $$\begin{pmatrix} CP_1 \\ CP_2 \end{pmatrix} = \begin{pmatrix} C_{00} & C_{01} \\ C_{10} & C_{11} \end{pmatrix} \begin{pmatrix} CP'_1 \\ CP'_2 \end{pmatrix},$$

where $C_{00}$, $C_{01}$, $C_{10}$, and $C_{11}$ are the elements of a matrix that corrects for IQ-mixer imperfections. In an example implementation, each modification settings circuit, $504_k$, contains registers that contain the matrix elements of three matrices:

$$C_k = \begin{pmatrix} C_{k00} & C_{k01} \\ C_{k10} & C_{k11} \end{pmatrix},$$

an IQ-mixer correction matrix;

$$S_k = \begin{pmatrix} \cos(\omega_k * TS * T_{clck1}) & -\sin(\omega_k * TS) * T_{clck1} \\ \sin(\omega_k * TS * T_{clck1}) & \cos(\omega_k * TS * T_{clck1}) \end{pmatrix},$$

a single side band frequency modulation matrix; and $$F_k = \begin{pmatrix} \cos(\phi_k) & -\sin(\phi_k) \\ \sin(\phi_k) & \cos(\phi_k) \end{pmatrix},$$

a frame rotation matrix, which rotates the IQ axes around the axis perpendicular to the IQ plane (i.e. the z-axis if I and Q are the x-axis and y-axis). In an example implementation, each modification settings circuit $504_k$ also contains registers that contain the elements of the matrix products $C_k S_k F_k$ and $S_k F_k$.

In the example shown, each pulse modification circuit $508_r$ is operable to process two raw outbound pulses CP'$_{2r}$ and CP'$_{2r+1}$ according to: the modification settings ops_cnfg$_{2r}$ and ops_cnfg$_{2r+1}$; the signals ops_ctrl$_{2r}$ and ops_ctrl$_{2r+1}$; and the signals pair$_{2r}$ and pair$_{2r+1}$. In an example implementation pair$_{2r}$ and pair$_{2r+1}$ may be communicated as ops_ctrl$_{2r}$ and ops_ctrl$_{2r+1}$. The result of the processing is outbound pulses CP$_{2r}$ and CP$_{2r+1}$. Such processing may comprise adjusting a phase, frequency, and/or amplitude of the raw outbound pulses CP'$_{2r}$ and CP'$_{2r+1}$. In an example implementation, ops_cnfg$_{2r}$ and ops_cnfg$_{2r+1}$ are in the form of a matrix comprising real and/or complex numbers and the processing comprises matrix multiplication involving a matrix representation of the raw outbound pulses CP$_{2r}$ and CP$_{2r+1}$ and the ops_cnfg$_{2r}$ and ops_cnfg$_{2r+1}$ matrix.

The control circuitry 502 is operable to exchange information with the pulser circuits $302_0$-$302_{L-1}$ to generate values of ops_confg$_0$-ops_confg$_{L-1}$ and f_demod$_0$-f_demod$_{L-1}$, to control routing circuitry 506 based on signals ops_slct$_0$-ops_slct$_{L-1}$ and dmod_slct$_0$-dmod_slct$_{L-1}$, and to update pulse modification settings $504_0$-$504_{K-1}$ based on IF$_0$-IF$_{L-1}$ and F$_0$-F$_{L-1}$ such that pulse modification settings output to pulse operations circuitry 358 are specifically tailored to each raw outbound pulse (e.g., to which quantum element 222 the pulse is destined, to which signal path 313 the pulse is destined, etc.) to be processed by pulse operations circuitry 358.

Each modification settings circuit $504_k$ comprises circuitry operable to store modification settings for later retrieval and communication to the pulse operations circuitry 358. The modification settings stored in each modification settings circuit $504_k$ may be in the form of one or more two-dimensional complex-valued matrices. Each signal path $313_0$-$313_{K-1}$ may have particular characteristics (e.g., non-idealities of interconnect, mixers, switches, attenuators, amplifiers, and/or circuits along the paths) to be accounted for by the pulse modification operations. Similarly, each quantum element $122_0$-$122_k$ may have a particular characteristics (e.g. resonance frequency, frame of reference, etc.). In an example implementation, the number of pulse modification settings, K, stored in the circuits 504 corresponds to the number of quantum element $122_0$-$122_{K-1}$ and of signal paths $313_0$-$313_{K-1}$ such that each of the modification settings circuits $504_0$-$504_{K-1}$ stores modification settings for a respective one of the quantum elements $122_0$-$122_{K-1}$ and/or paths $313_0$-$313_{K-1}$. In other implementations, there may be more or fewer pulse modification circuits 504 than signal paths 313 and more or fewer pulse modification circuits 504 than quantum elements 122 and more or fewer signal paths 313 than quantum elements 122. The control circuitry 502 may load values into the modification settings circuit $504_0$-$504_{K-1}$ via signal 503.

The routing circuitry 506 is operable to route modification settings from the modification settings circuits $504_0$-$504_{L-1}$ to the pulse operations circuit 358 (as ops_confg$_0$-ops_confg$_{L-1}$) and to the pulsers $302_0$-$302_{L-1}$ (as f_dmod$_0$-f_dmod$_{L-1}$). In the example implementation shown, which of the modification settings circuits $504_0$-$504_{K-1}$ has its/their contents sent to which of the pulse modification circuits $508_0$-$508_{R-1}$ and to which of the pulsers $302_0$-$302_{L-1}$ is controlled by the signal 505 from the control circuitry 502.

The signal ops_slct$_1$ informs the pulse operations manager 356 as to which modification settings $504_k$ to send to the pulse modification circuit $508_1$. The pulser $302_1$ may determine ops_slct$_1$ based on the particular quantum element $122_k$ and/or signal path $313_k$ to which the pulse is to be transmitted (e.g., the resonant frequency of the quantum element, frame of reference, and/or mixer correction). The determination of which quantum element and/or signal path to which a particular pulser $302_1$ is to send an outbound pulse at a particular time may be predetermined in the quantum algorithm description or may be determined based on calculations performed by the pulser $302_1$ and/or others of the pulsers $302_0$-$302_{L-1}$ during runtime. The control circuitry 502 may then use this information to configure the routing block 506 such that the correct modification settings are routed to the correct one or more of the pulse modification circuits $508_0$-$508_{L-1}$.

In an example implementation, the digital signal IF$_1$ instructs the pulse operations manager 356 to update a frequency setting of the modification settings circuit $504_k$ indicated by ops_slct$_1$. In an example implementation, the frequency setting is the matrix $S_k$ (described above) and the signal IF$_1$ carries new values indicating the new $\omega_k$ to be used in the elements of the matrix $S_k$. The new values may, for example, be determined during a calibration routine (e.g., performed as an initial portion of the quantum algorithm) in which one or more of the pulsers $302_0$-$302_{L-1}$ sends a series of outbound pulses CP, each at a different carrier frequency, and then measures the corresponding inbound signals AI.

In an example implementation, the signal F$_1$ instructs the pulse operations manager 356 to update a frame setting of the modification settings circuit $504_k$ indicated by ops_slct$_1$. In an example implementation, the frame setting is the matrix $F_k$ (described above) and the signal F$_1$ carries a rotation matrix F$_1$ which multiplies with $F_k$ to rotate $F_k$. This can be written as, $$F_k = F_l F_k = \begin{pmatrix} \cos(\Delta\phi) & -\sin(\Delta\phi) \\ \sin(\Delta\phi) & \cos(\Delta\phi) \end{pmatrix} \begin{pmatrix} \cos(\phi_k) & -\sin(\phi_k) \\ \sin(\phi_k) & \cos(\phi_k) \end{pmatrix} = \begin{pmatrix} \cos(\phi_k + \Delta\phi) & -\sin(\phi_k + \Delta\phi) \\ \sin(\phi_k + \Delta\phi) & \cos(\phi_k + \Delta\phi) \end{pmatrix},$$

where $\phi_k$ is the frame of reference before the rotation and $\Delta\phi$ is the amount by which to rotate the frame of reference. The pulser $302_1$ may determine $\Delta\phi$ based on a predetermined algorithm or based on calculations performed by the pulsers $302_1$ and/or others of the pulsers $302_0$-$302_{L-1}$ during runtime.

In an example implementation, the signal dmod_sclt$_1$ informs the pulse operations manager 356 from which of the modification settings circuits $504_k$ to retrieve values to be sent to pulser $302_1$ as f_dmod$_1$. The pulser $302_1$ may determine dmod_slct$_1$ based on the particular quantum element $122_k$ and/or signal path $315_k$ from which the pulse to be processed arrived. The determination of from which quantum element and/or signal path a particular pulser $302_1$ is to process an inbound pulse at a particular time may be predetermined in the quantum algorithm description or may be determined based on calculations performed by the pulser $302_1$ and/or others of the pulsers $302_0$-$302_{L-1}$ during runtime. The control circuitry 502 may then use this information to configure the routing block 506 such that the correct modification settings are routed to the correct one of the pulsers $302_0$-$302_{L-1}$. For example, when pulse generation circuit $302_1$ needs to demodulate a pulse signal AI$_1$ from quantum element $122_k$, it will send a dmod_sclt$_1$ signal instructing the pulse operation manager 356 to rout the element $SF_{k00}=\cos(\omega_k*\text{time\_stamp}+\phi_k)$ from modification settings circuit $504_k$ to pulser $302_1$ (as f_dmod$_1$).

In the example implementation shown, the digital signals $C_0$-$C_{K-1}$ provide information about signal-path-specific modification settings to be used for each of the signal paths $313_0$-$313_{K-1}$. For example, each signal $C_k$ may comprise a matrix to be multiplied by a matrix representation of a raw outbound pulse CP'$_1$ such that the resulting output outbound pulse is pre-compensated for errors (e.g., resulting from imperfections in mixers, amplifiers, wiring, etc.) introduced as the outbound pulse propagates along signal path $313_k$. The result of the pre-compensation is that output outbound pulse CP$_1$ will have the proper characteristics upon arriving at the quantum processor 218. The signals $C_0$-$C_{K-1}$ may, for example, be calculated by the quantum controller 210 itself, by the programming subsystem 202, and/or by external calibration equipment and provided via I/O manager 368. The calculation of signals may be done as part of a calibration routine which may be performed before a quantum algorithm and/or may be determined/adapted in real-time as part of a quantum algorithm (e.g., to compensate for temperature changes during the quantum algorithm).

Figure 6B:
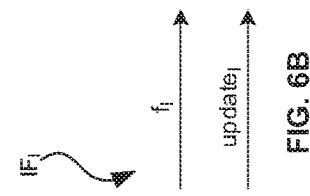
FIG. 6B shows example components of the control signal $IF_1$ of FIG. 6A.
Figure 6A:
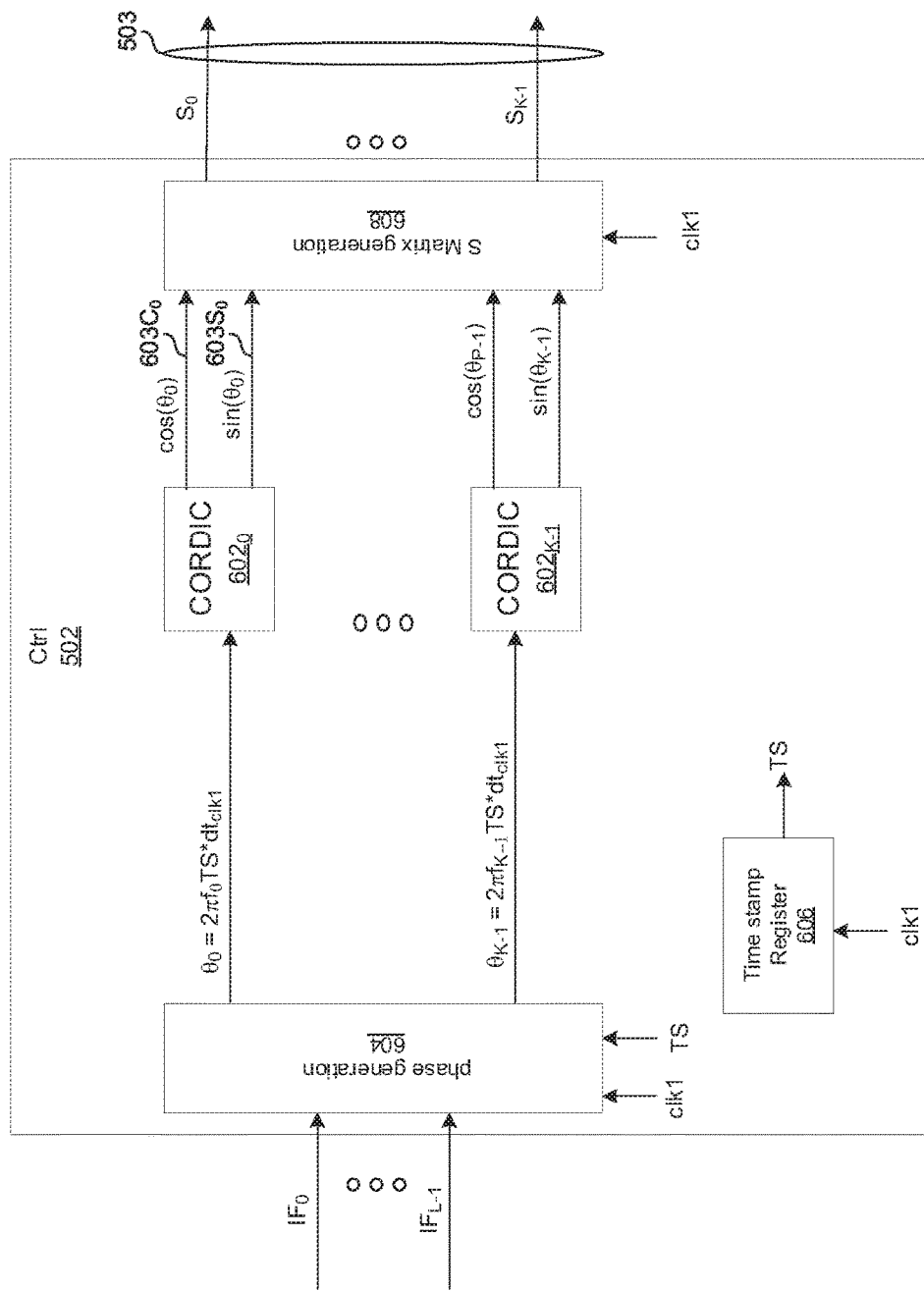
FIG. 6A shows an example frequency generation circuitry of the quantum controller of FIG. 3B.

FIG. 6A shows frequency generation circuitry of the quantum controller of FIG. 3B. In the example implementation shown, the frequency generation circuitry is part of control circuitry 502 of pulse operations manager circuitry 356. The frequency generation circuitry comprises K coordinate rotation digital computer (CORDIC) circuits $602_0$-$602_{K-1}$, phase generation circuitry 604, timestamp register 606, and S-Matrix generation circuitry 608.

Each CORDIC circuit $602_k$ is operable to compute cosine and sine of its input, $\theta_k$, thus generating two signals $\cos(\theta_k)$ and $\sin(\theta_k)$.

The phase generation circuitry 604 is operable to generate the CORDIC input parameters $\theta_0$-$\theta_{k-1}$ based on: (1) the frequency setting signals IF$_0$-IF$_{L-1}$ from the pulsers $302_0$-$302_{L-1}$; and (2) the contents, TS, of the timestamp register 606.

The timestamp register 606 comprises circuitry (e.g., a counter incremented on each cycle of the clock signal clk1) operable to track the number of cycles of clk1 since a reference point in time (e.g., power up of the quantum controller 210, start of execution of set of instructions of a quantum algorithm by the quantum controller 210, etc.).

In the example shown, the phase generation circuitry 604 sets $\theta_0=2\pi f_0(TS)(dt_{clk1})$, where $f_0$ is a frequency determined from the signal IF$_0$, TS is the number of clock cycles counted from the reference point and $dt_{clk1}$ is the duration of a single clock cycle of clk1. This leads to the CORDIC outputs being a pair of phase-quadrature reference signals, $\cos(2\pi f_0(TS)(dt_{clk1}))$ and $\sin(2\pi f_0(TS)(dt_{clk1}))$, as in the example shown, which are used to generate the $S_0$ rotation matrix that rotates at a frequency $f_0$.

As shown in FIG. 6B, the signal $IF_1$ may comprise an update component and an $f_1$ component. In an example implementation, when update, is asserted then the phase generation circuitry updates one of more of $f_0$-$f_{K-1}$ to be the value of $f_1$.

The S-matrix generation circuitry 608 is operable to build the matrices $S_0$-$S_{K-1}$ from the outputs of the CORDIC circuits $602_0$-$602_{K-1}$. In an example implementation, the S-matrix generation circuit 606 is operable to synchronize changes to the S matrices such that any matrix update occurs on a desired cycle of clock clk1 (which may be determined by the control information $IF_0$-$IF_{L-1}$).

With K CORDIC circuits $602_k$, the frequency generation circuitry is operable to concurrently generate K S-matrices. In instances that more than K frequencies are needed over the course of a set of instructions, the phase generation circuit 604 is operable to change the input parameter $\theta_k$ of one or more of the CORDIC circuits $602_0$-$602_{K-1}$ to stop generating one frequency and start generating the K+1$^{th}$ frequency. In some instances, it may be necessary for the new frequency to start at a phase $\theta$ that would have been the phase if the new frequency was being generated from the initial reference time (e.g., because the new frequency would be used to address a quantum element that has a resonance at the new frequency and that was coherent since the reference point). In some other instances, it might be necessary to start the new frequency from the phase that the old frequency ended in. The phase generation circuit 604 and timestamp register 606 enable both of these possibilities.

Figure 7:
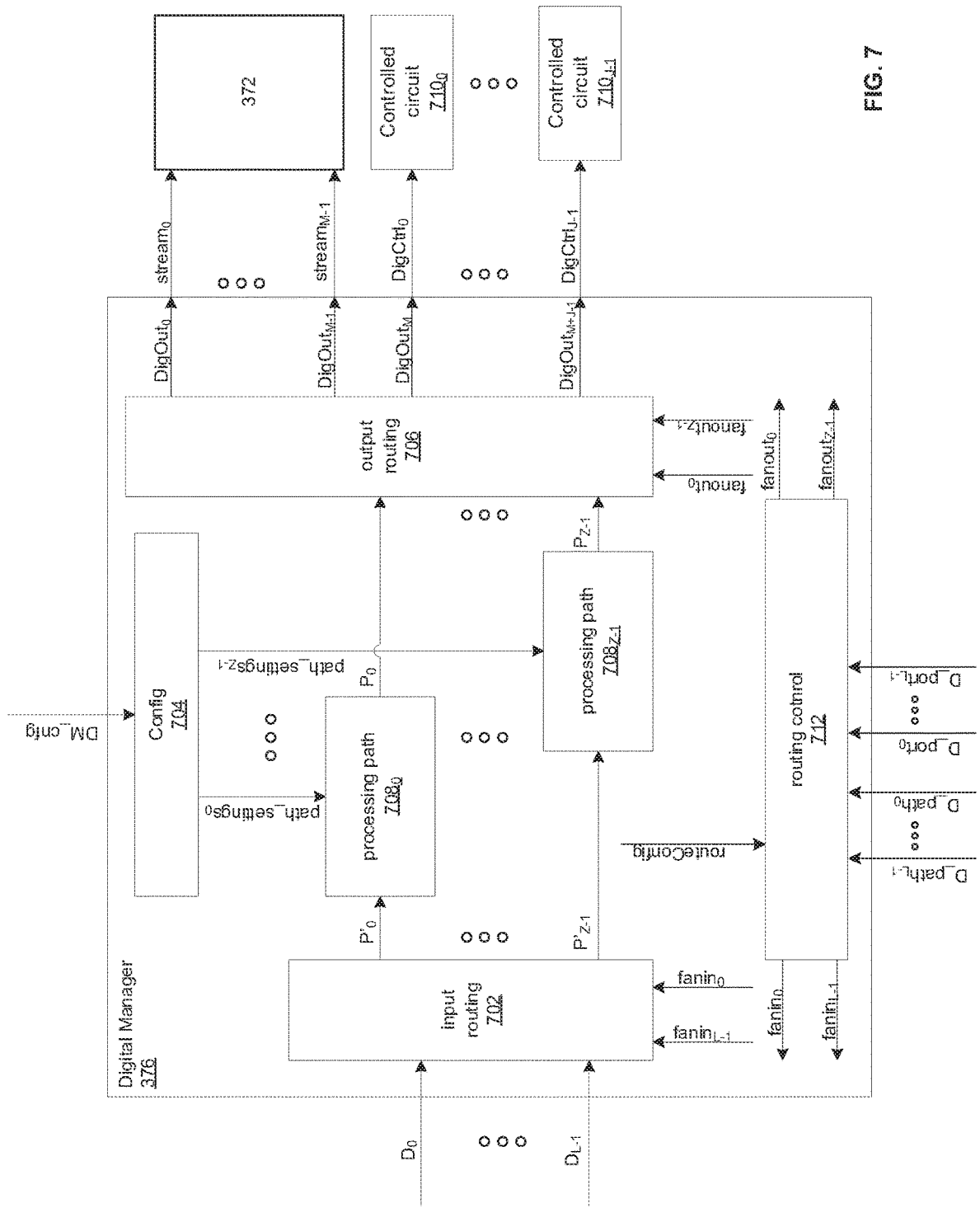
FIG. 7 shows an example implementation of the digital manager of FIG. 3B.

FIG. 7 shows an example implementation of the digital manager of FIG. 3B. Shown in FIG. 7 are the digital manager 376, controlled circuits $710_0$-$710_{J-1}$, and input manager 372.

The example implementation of the digital manager 376 comprises input routing circuit 702, configuration circuit 704, output routing circuit 706, processing paths $708_0$-$708_{Z-1}$ (where Z is an integer), and routing control circuit 712.

The configuration circuit 704 is operable to store configuration settings and use those settings to configure the processing paths $708_0$-$708_{Z-1}$ and/or the routing controller 712. The settings may, for example, be loaded via the signal DM_config as part of the quantum algorithm description provided by quantum programming subsystem 202. The settings may comprise, for example, one or more of: a bitmap on which may be based a determination of which of signals $D_0$-$D_{L-1}$ to route to which of signals $P'_0$-$P'_{Z-1}$ for one or more instructions of a quantum algorithm; a bitmap on which may be based a determination of which processing path outputs $P_0$-$P_{Z-1}$ to route to which of $DigOut_0$-$DigOut_{J+M-1}$ for one or more instructions of a quantum algorithm; and one or more bit patterns which processing paths $708_0$-$708_{Z-1}$ may convolve with one or more of the signals $P'_0$-$P'_{Z-1}$ for one or more instructions of a quantum algorithm.

The input routing circuit 702 is operable to route each of the digital signals $D_0$-$D_{L-1}$ to one or more of the processing paths $708_0$-$708_{Z-1}$. At any given time (e.g., for any particular instruction of every pulser $302_1$ of pulsers $302_0$-$302_L$), the input routing circuit 702 may determine to which of the processing paths $708_0$-$708_{Z-1}$ to rout the signal $D_1$ of signals $D_0$-$D_{L-1}$ based on the signal $fanin_1$ of signals $fanin_0$-$fanin_{L-1}$. That is, for a particular instruction, the digital signal $D_1$ may be routed to any one or more of paths $708_0$-$708_{Z-1}$ based on the value of $fanin_1$ for that instruction. For example, $fanin_1$ may be a Z-bit signal and a state of each bit of $fanin_1$ during a particular instruction may indicate whether $D_1$ is to be routed to a corresponding one of the Z processing paths $708_0$-$708_{Z-1}$ during that instruction. An example implementation of the input routing circuit 702 is described below with reference to FIG. 8.

The output routing circuit 706 is operable to route each of the digital signals $P_0$-$P_{Z-1}$ to one or more of $DigOut_0$-$DigOut_{J+M-1}$ (In the example shown $DigOut_0$-$DigOut_{J+M-1}$ connect to $stream_0$-$stream_{M-1}$, respectively, and $DigOut_M$-$DigOut_{J+M-1}$ connect to DigCtrl0-DigCtrlJ−1, respectively). At any given time (e.g., for any particular instruction of every pulser $302_1$ of pulsers $302_0$-$302_L$), the output routing circuit 706 may determine to which of $DigOut_0$-$DigOut_{J+M-1}$ to rout the signal $P_1$ of the signals $P_0$-$P_{L-1}$ based on the signal fanout of signals $fanout_0$-$fanout_{Z-1}$. That is, for a particular instruction, the digital signal $P_z$ (z an integer between 0 and Z) may be routed to any one or more of $DigOut_0$-$DigOut_{J+M-1}$ based on the value of $fanout_z$ for that instruction. For example, values of $fanout_z$ may be (J+M−1) bits and a state of each bit of $fanout_z$ during a particular instruction may indicate whether $P_z$ is to be routed to a corresponding one of the J+M−1 signals DigOut during that instruction. An example implementation of the output routing circuit 704 is described below with reference to FIG. 8.

Each of the processing path circuits $708_0$-$708_{Z-1}$ is operable to manipulate a respective one of signals $P'_0$-$P'_{Z-1}$ to generate a corresponding manipulated signal $P_0$-$P_{Z-1}$. The manipulation may comprise, for example, introducing a delay to the signal such that the resulting one or more of $DigOut_0$-$DigOut_{J+M-1}$ reach(es) its/their destination (a controlled circuit 710 and/or input manager 372) at the proper time with respect to the time of arrival of a corresponding quantum control pulse at the corresponding destination.

Each of the controlled circuits $710_0$-$710_{J-1}$ and input manager 372 is a circuit which, at least some of the time, needs to operate synchronously with quantum control pulses generated by one or more of pulsers $302_0$-$302_{L-1}$ (possibly a reflection/return pulse from a quantum processor in the case of input manager 372). Accordingly, each of the control circuits $710_0$-$710_{J-1}$ receives a respective one of control signals $DigOut_0$-$DigCtrl_{J-1}$ that is synchronized with a respective quantum control pulse. Similarly, input manager 372 receives a plurality of the DigOut signals (one for each stream input).

The routing controller 712 comprises circuitry operable to generate signals $fanin_0$-$fani_{L-1}$ and $fanout_0$-$fanout_{Z-1}$ based on $D\_path_0$-$D\_path_{L-1}$, $D\_port_0$-$D\_port_{L-1}$, and/or information stored in configuration circuit 704.

Figure 8:
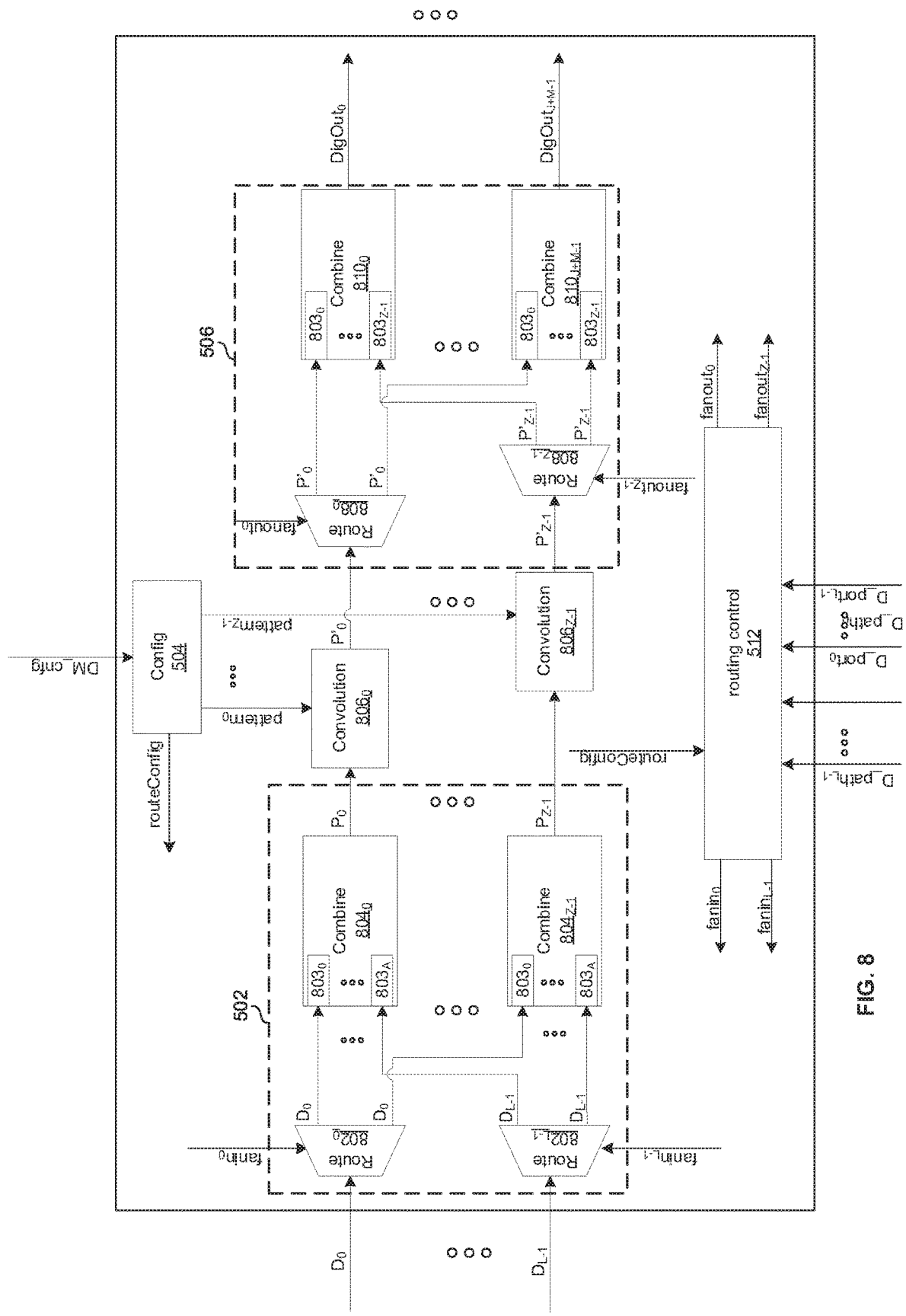
FIG. 8 shows an example implementation of the digital manager of FIG. 3B.

FIG. 8 shows an example implementation of the digital manager of FIG. 3B. The example input routing circuit 502 comprises routing circuits $802_0$-$802_{L-1}$ and combining circuits $804_0$-$804_{L-1}$. The example output routing circuitry 506 comprises circuits routing circuits $808_0$-$808_{Z-1}$ and combining circuits $810_0$-$810_{J-1}$. The example processing path circuits are convolution circuits $806_0$-$806_{Z-1}$.

Each of the routing circuits $802_0$-$802_L$ is operable to route a respective one of signals $D_0$-$D_{L-1}$ to one or more of the combining circuits $804_0$-$804_{Z-1}$. To which of combining circuit(s) $804_0$-$804_{Z-1}$ the signal $D_1$ is routed is determined based on the signal $fanin_1$. In an example implementation, each signal $fanin_1$ is a Z-bits signal and, for a pulser instruction, the value of bit z of the signal $fanin_1$ determines whether the signal $D_l$ is to be routed to combining circuit $804_z$ for that instruction. The value of fanin$_1$ may be updated on a per-instruction basis.

Each of combining circuits $804_0$-$804_{L-1}$ is operable to combine up to L of the signals D0-DL-1 to generate a corresponding one of signals $P_0$-$P_{Z-1}$. In an example implementation, the combining comprises OR-ing together the values of the up to L signals.

Each of the routing circuits $808_0$-$808_{Z-1}$ is operable to route a respective one of signals $P'_0$-$P'_{Z-1}$ to one or more of the combining circuits $810_0$-$810_{J-1}$. To which of combining circuit(s) $810_0$-$810_{J-1}$ the signal $P'_z$ is routed is determined based on the signal fanout$_z$. In an example implementation, each signal fanout$_z$ is a (J+M−1)-bit signal and the value of bit j+m−1 of the signal fanout$_z$ determines whether the signal $P'_z$ is to be routed to combining circuit $804_{j+m-1}$. In an example implementation the value of fanout$_z$ is preconfigured before the runtime of the quantum algorithm, however, in another implementation it may be updated dynamically (e.g., on a per-instruction basis).

Each combining circuit of combining circuits $810_0$-$810_{J-1}$ is operable to combine up to Z of the signals $P'_0$-$P'_{Z-1}$ (received via inputs $803_0$ to $803_{Z-1}$) to generate a corresponding one of signals DigOut$_0$-DigOut$_{J+M-1}$. In an example implementation, the combining comprises OR-ing together the values of the up to Z signals.

Each convolution circuit $806_z$ is operable to convolve signal $P_z$ with pattern$_z$ to generate signal $P'_z$. In an example implementation, pattern$_z$ is preconfigured before runtime of the quantum algorithm, however, in another implementation it may be updated dynamically. pattern$_z$ may be determined based on: the destination(s) of signal $P_z$ (e.g., to which of controlled circuits 510 and/or input of input manager 352 Pz is intended); characteristics of the corresponding quantum control pulse (e.g., any one or more of its frequency, phase, amplitude, and/or duration); and/or process, temperature, and/or voltage variations.

Figure 9A:
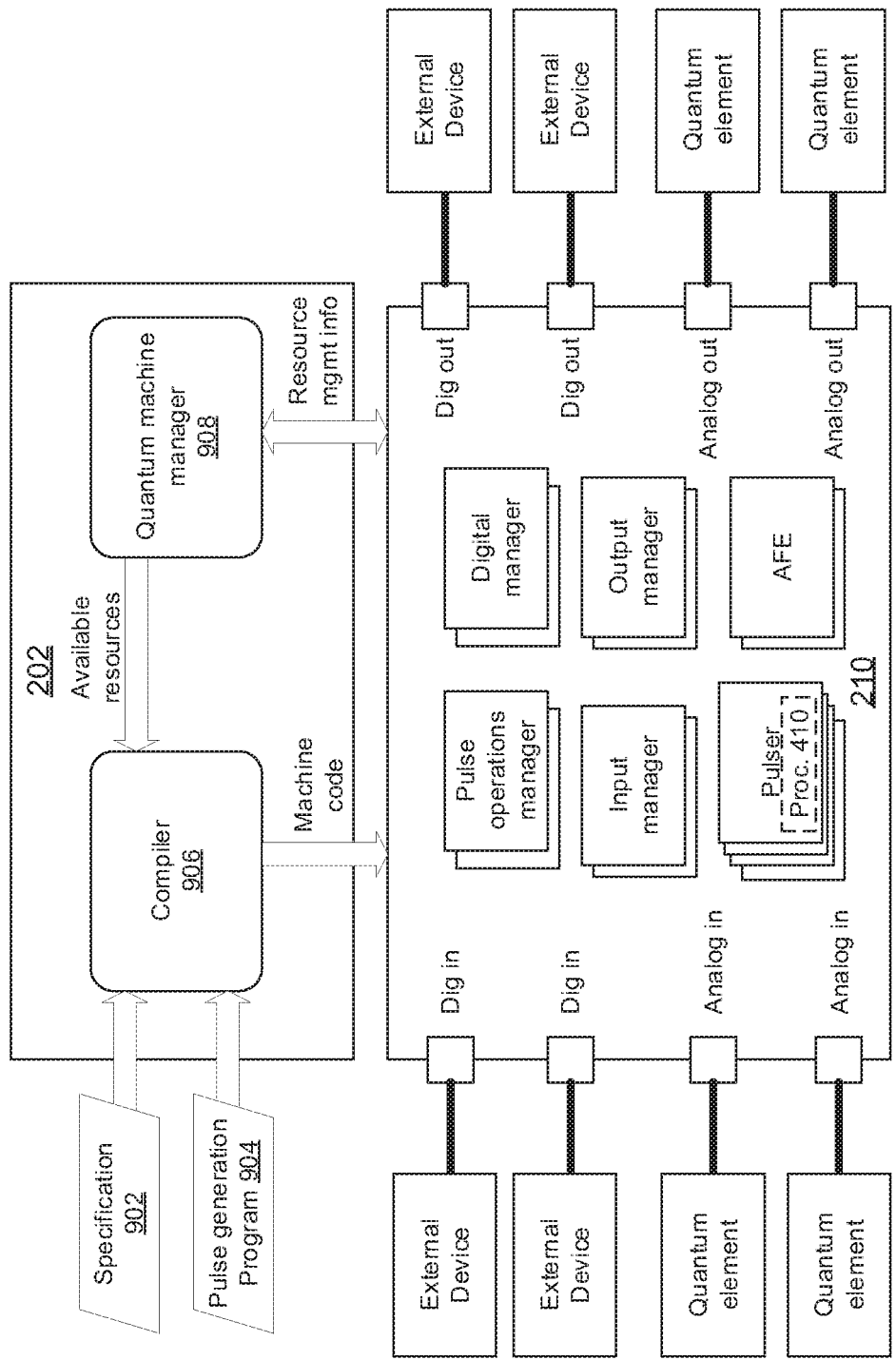
FIG. 9A illustrates configuration and control of the quantum controller via the quantum programming subsystem.

FIG. 9A illustrates configuration and control of the quantum controller via the quantum programming subsystem. In FIG. 9A, the quantum controller 210 is comprises one or more instances of various circuits (such as the pulser, input manager, output manager, digital manager, pulse operations manager, and analog front end circuits described above). Connected to the inputs and outputs of the quantum controller 210 are a plurality of external devices (e.g., oscilloscopes, waveform generators, spectrum analyzers, mixers, amplifiers, etc.) and a plurality of quantum elements. These physical circuits can be allocated and deallocated independently of one another such that the physical resources of the quantum controller 210, and the quantum elements and external devices connected to the quantum controller 210 via the analog and digital inputs and outputs, can be organized into one or more "quantum machines."

Also shown in FIG. 9A are a compiler 906 and quantum machine manager 908 of the quantum programming subsystem 202.

Figure 9B:
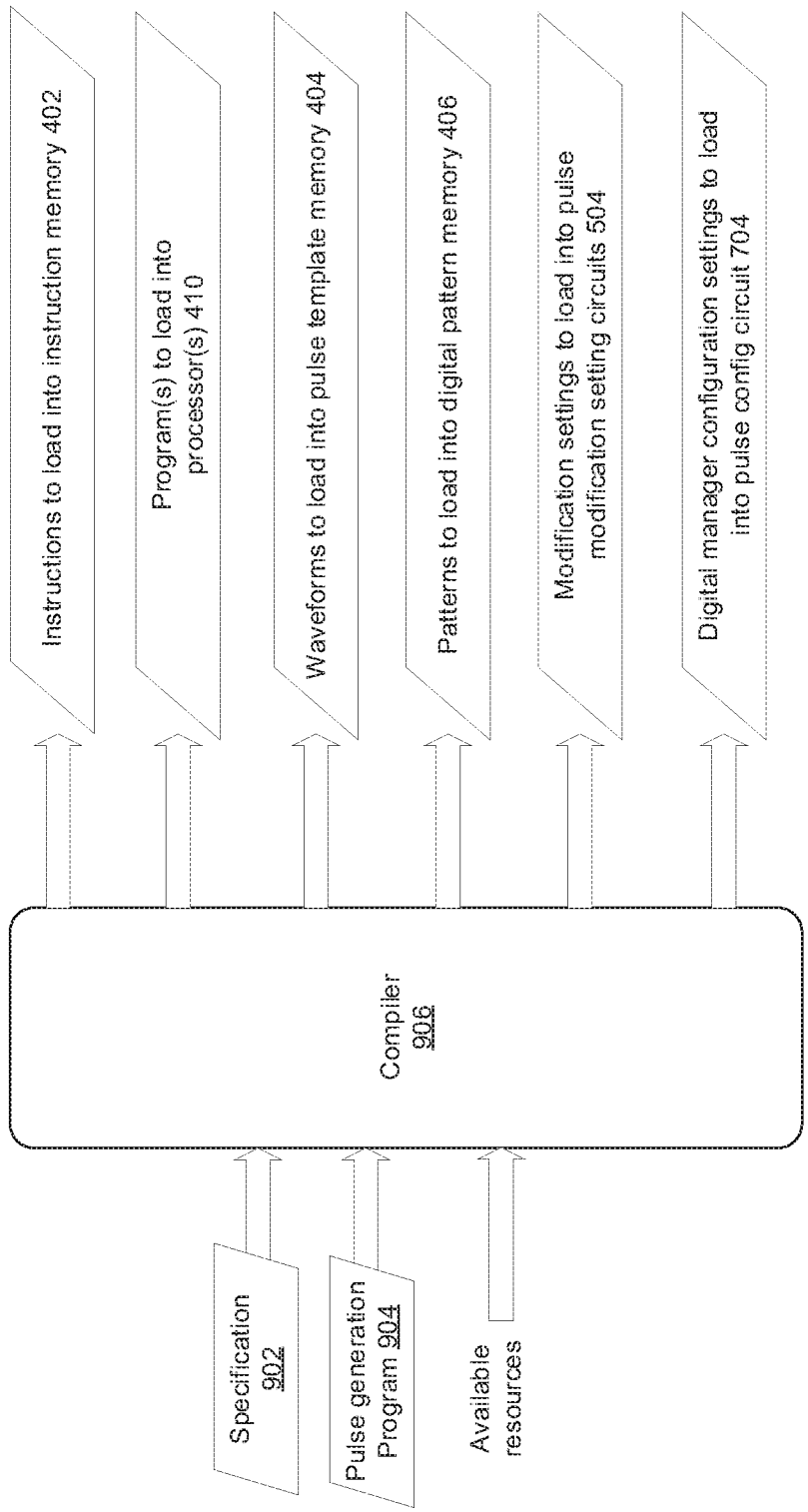
FIG. 9B shows example inputs and outputs of the compiler 906.

The compiler 906 comprises circuitry operable to generate a machine code quantum algorithm description based on: (1) a specification file 902; (2) a pulse generation program file 904; and (3) a resources management data structure from the quantum machine manager 908. As shown in FIG. 9B, from these inputs, the compiler 906 may generate: one or more sets of instructions to be loaded into instruction memory 402 of one or more of the pulsers $302_0$-$302_{L-1}$; one or more programs (i.e., sets of instructions) to be available for execution by one or more of the processors 410; waveforms to be loaded into pulse template memory 404 of one or more of the pulsers $302_0$-$302_{L-1}$; digital patterns to be loaded into digital pattern memory 406 of one or more of the pulsers $302_0$-$302_{L-1}$; modification settings (e.g., CSF matrices) to be loaded into one or more pulse modification settings circuits 504; digital manager configuration settings to be loaded into configuration circuitry 704.

The specification file 902 identifies resources of a quantum machine which the compiler then attaches to physical circuits of the quantum controller 210 during compilation. Using pulser circuits as just one example type of resource, a specification file 902 may specify that a quantum machine needs two pulsers, but not specify any specific pulser circuits. The compiler 906 may then—based on the specification file 902, the program file 904, and/or the available resources indicated by the quantum machine manager 908—allocate pulsers $302_0$ and $302_1$ to be the two pulsers of that quantum machine.

The pulse generation program file 904 comprises statements that define a sequence of operations to be performed by the quantum machine defined in the specification file 902. Such operations typically include the generation of one or more analog pulses to be sent to a controlled element, such as a quantum element. Such operations typically include measuring one or more return pulses from the controlled element. The pulse generation program is also referred to herein as a QUA program. Functions, syntax, etc. of the QUA programming language are described below. In an example implementation, Python is used as a "host" language for the QUA program. This allows the program to leverage Python syntax/constructs (Python variables, functions, etc.), but it is still a QUA—not Python—program to be compiled by the compiler 906 to generate QOP machine code.

In an example implementation, a QUA program defines the sequence of: (1) Pulses sent to the quantum device; (2) Measurements of pulses returning from the quantum device; (3) Real-time classical calculations done on the measured data; (4) Real-time classical calculations done on general classical variables; and (5) Real-time decision making that affects the flow of the program.

In addition to the specification of which pulses are played, a QUA program can also specify when they should be played through both explicit and implicit statements and dependency constructs. Thus, a QUA program can define exactly the timing in which pulses are played, down to the single sample level.

In an example implementation, the pulses syntax defines an implicit pulse dependency, which determines the order of pulse execution. The dependency can be summarized as follows: (1) Each pulse is played immediately, unless dependent on a previous pulse; (2) Pulses applied to the same quantum element are dependent on each other according to the order in which they are written in the program In another implementation, timing and ordering or pulses may be set forth explicitly in the QUA program.

Figure 10A:
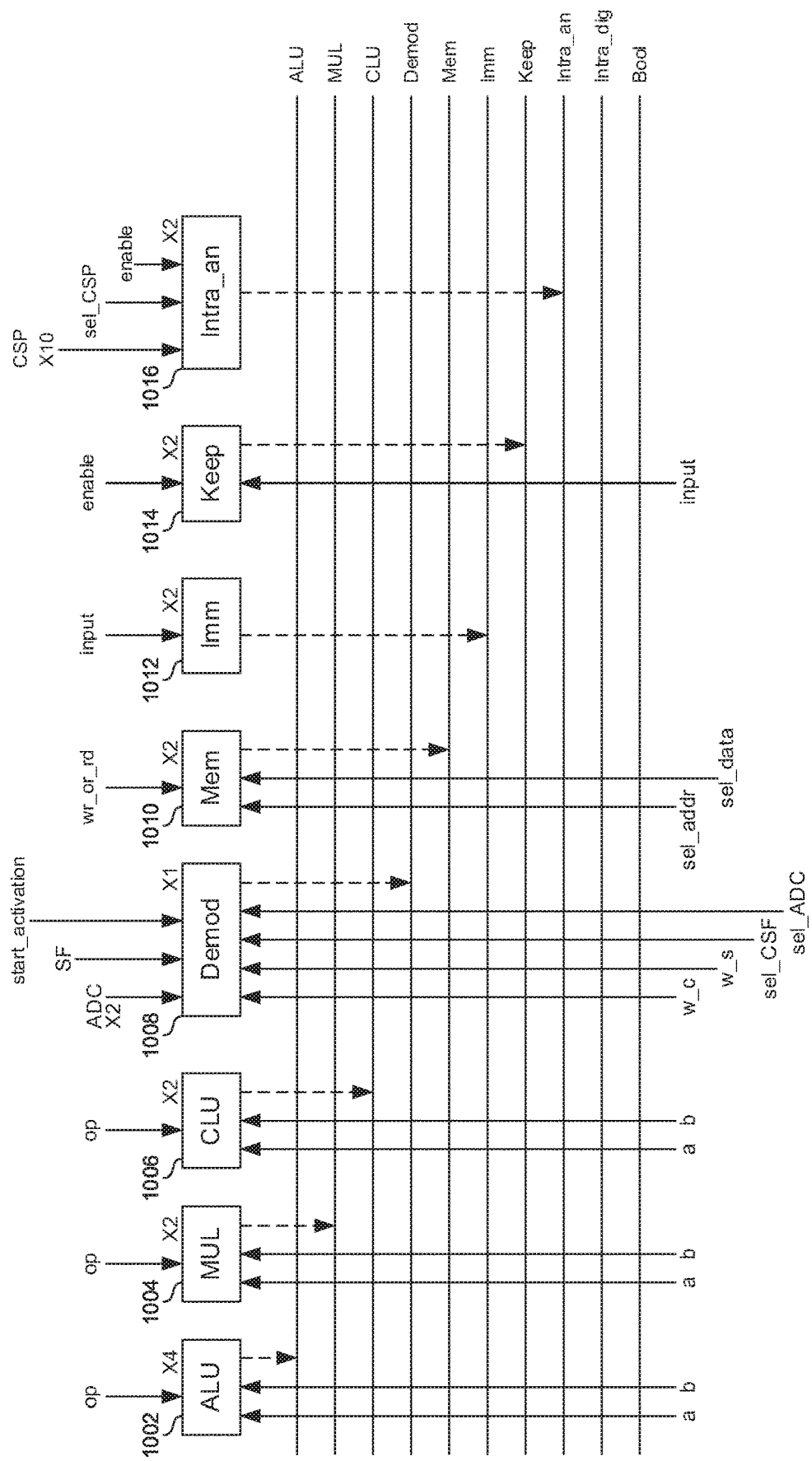
FIGS. 10A and 10B show an example implementation of computer and/or signal processing (CSP) circuitry.
Figure 10B:
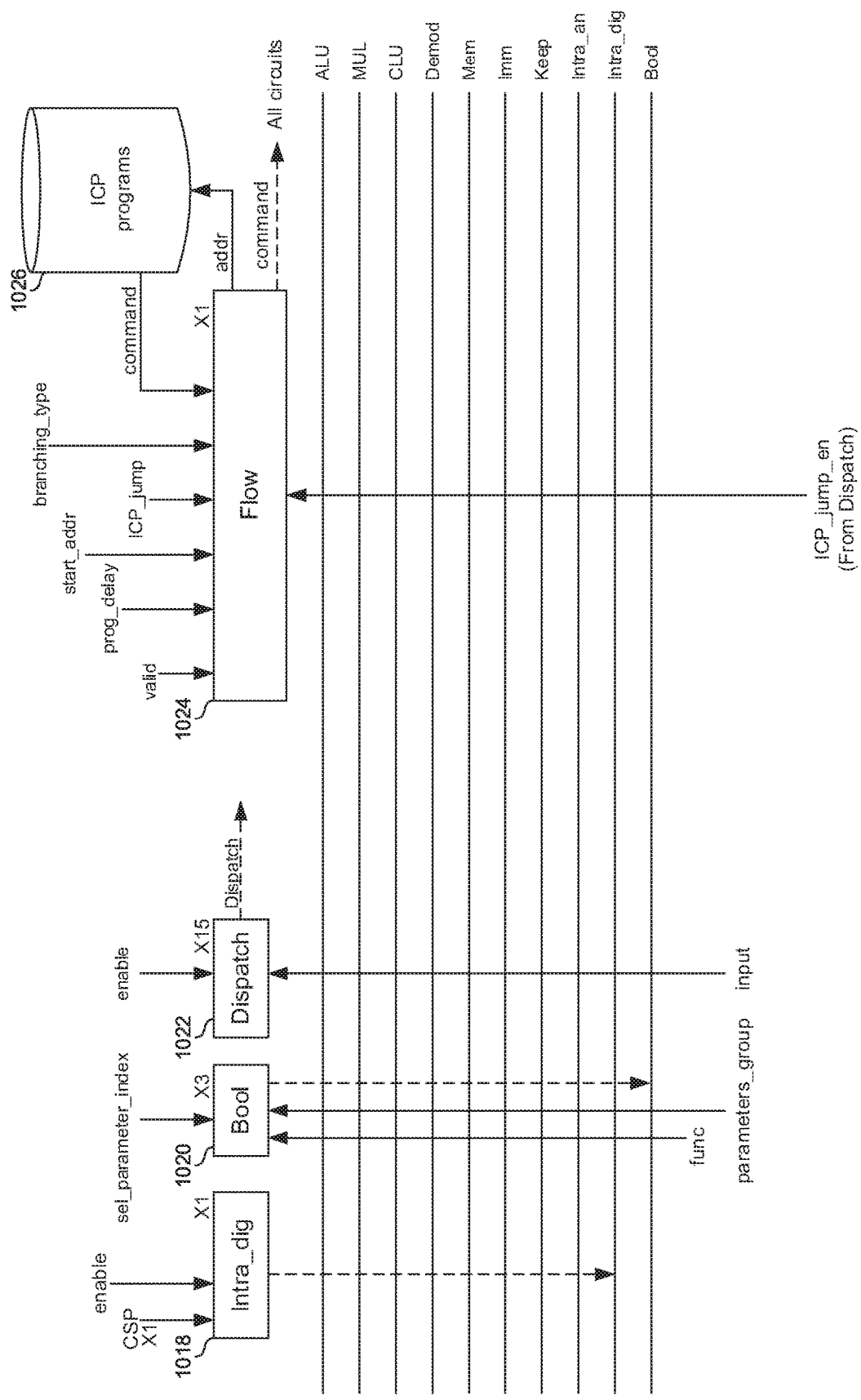

FIGS. 10A and 10B show an example implementation of CSP circuitry. The depicted CSP circuitry 410 of pulser $302_1$ is operable to perform real-time calculations and send the results to different destinations inside the pulser $302_1$ as well as to CSP circuitry 410 in others of the pulsers $302_0$-$302_{L-1}$.

The CSP circuit may comprise a plurality of building blocks. The example implementation of a CSP circuit 410 of FIGS. 10A and 10B comprises four arithmetic logic unit (ALU) circuits 1002, two multiplier logic unit (MUL) circuits 1004, two comparison logic unit (CLU) circuits 1006, one demodulator circuit 1008, two memory circuits 1010, two immediate memory circuits 1012, two keep (e.g., storage or register) circuits 1014, two intra_analog circuits 1016, one intra-digital circuit 1018, three Boolean function circuits 1020, one dispatch circuit 1022, and one flow circuit 1024. Each of the circuits in FIGS. 10A and 10B receives one or more inputs (solid arrows) and one or more outputs (dashed arrows). The number of identical circuits in a single instance of the CSP 410 is denoted by "Xn" at the top right corner of the box. The horizontal lines are the CSP buses, each carrying 32 bits in an example implementation. The output of each circuit is connected to a single bus and therefore the buses are named after their corresponding "source" boxes (e.g. bus ALU1 is the bus that is connected to the output of $ALU_1$).

The inputs of each circuit of FIGS. 10A and 10B can be divided to three categories: (1) Program inputs: inputs which values are specified in the commands of the CSP program (down-arrows in FIGS. 10A and 10B); (2) Bus inputs: inputs coming from the buses (up-arrows in FIGS. 10A and 10B). Each bus input, of each logical box, can be connected to any one of the buses; and (3) External logic inputs: inputs coming from an external source (down-arrows in FIGS. 10A and 10B).

A CSP program may be a list of CSP commands, where each command specifies the program inputs and the bus inputs of all circuits of the CSP 410. Specifying the bus inputs is equivalent to specifying which bus is connected to each input. A CSP command may last for one clock cycle and then the CSP 410 goes to the next command according to the flow circuit 1024, which is described below.

Note: each operation of each circuit of FIGS. 10A and 10B has a certain latency, i.e. a number of cycles from a certain set of inputs until the corresponding output appears. The compiler 906 may take this into account when generating a CSP program.

The structure of a command of a CSP program may be: [circuit_name]$_i$ (program inputs; bus inputs), where the index i in the command specifies which instance of a plurality of instances of the circuit is to be used (e.g., $ALU_1$ refers to the first instance of the four ALUs 1002).

Each ALU circuit 1002 is operable to perform a op b, where op is selected from:

1) select_a: a and b enter and the output is a.
2) select_b: a and b enter and the output is b.
3) and: Only if a and b are 1 the output is 1. Otherwise 0.
4) or: If a or b are 1 the output is 1. Otherwise 0.
5) xor: If a and b are different the output is 1. Otherwise 0.
6) add: The output is a+b.
7) sub: The output is a−b.
8) shift_l: a is shifted left by b.
9) shif_r: a is shifted right by b.
10) signed_cond_if: If a>=0 return a, else return b, where a is a signed integer in 2's complement.
11) unsigned_cond_if: If a>0 return a, else return b, where a is an unsigned integer.

For example, assuming: Mem0=11000000 . . . 00 and Keep0=0000000 . . . 011, then: the command $ALU0_0$ (op=add; a=$Mem_0$, b=$Keep_0$) corresponds to $ALU_0$=$Mem_0$+$Keep_0$=11000 . . . 011, and the command $ALU_1$ (op=shift_r; a=$Mem_0$, b=$Keep_0$) coresponds to $ALU_1$=00011000 . . . 0.

Each MUL circuit 1004 is operable to perform a multiplication between a and b, namely aXb. The op input defines the representations of the inputs and output (e.g., may define number of bits, whether the bits are signed or unsigned, floating point, integer, exponential, etc.). For example, op may define the representation as follows: If op=int, so each input is signed 18 bits number [17:0] and the output is signed 32 bits number; If op=frac, so each input is signed 2.16 fraction [29:12] and the output is signed 4.28 fraction; If op=real, so each input is 3.16+8 exp qm real value [31:5] and the output is 3.16+8 exp qm real value. (3.16 signed)× exp (signed 8 bits)

For example, assuming $Mem_0$=11111 . . . 1111 and Mem1=00000 . . . 001 then the command $MUL_0$ (op=int; a=$Mem_1$, b=$Mem_0$) results in $MUL_0$=111111 . . . 111, because it is just a (+1)X(−1)=−1.

Each CLU circuit 1006 is operable to perform a comparison operation between a and b. For example: If op=a_greater it will return TRUE if a>b, If op=a_not_smaller it will return TRUE if a>=b, If op=b_greater it will return TRUE if a<b, If op=b_not_smaller it will return TRUE if a<=b, If op=equality it will return TRUE if a=b. In an example, a and b are unsigned and True is 32 bits of 1 (i.e., 111 . . . 1) and False is 32 bits of 0 (i.e., 0000 . . . 0). For example, assuming $Mem_0$=11000 . . . 00 and $Mem_1$=000 . . . 010 then the command $CLU_0$ (op=a_greater; a=$Mem_0$, b=$Mem_1$) results in TRUE=11111 . . . 11.

Each demodulation circuit 1008 is operable to perform weighted demodulation on a signal coming from a selected analog to digital converter (ADC), with a selected intermediate frequency (IF) and phase. The de-modulated signal may pass through an accumulator to perform a dot product. This may be done in the following way:

1. The demodulation logic unit receives input data from 2 ADCs, and selects the data from one of them. In an example implementation, once each cycle of a 250 MHz system clock, the demod receives 4 samples (since the ADC samples at 1 GHz) denoted here as $S_{TS,0}$, $S_{TS,1}$ $S_{TS,2}$ $S_{TS,3}$, where TS is the time stamp—the number of the current system clock cycle.

2. The demodulation unit receives 8 other inputs from the selected CSF module in the CSF manager (according to SF_sel):

$$\cos[\omega_{IF} t_{TS,0} + \Phi_F], \cos[\omega_{IF} t_{TS,1} + \Phi_F], \cos[\omega_{IF} t_{TS,2} + \Phi_F], \cos[\omega_{IF} t_{TS,3} + \Phi_F]$$

and $$\sin[\omega_{IF} t_{TS,0} + \Phi_F], \sin[\omega_{IF} t_{TS,1} + \Phi_F], \sin[\omega_{IF} t_{TS,2} + \Phi_F], \sin[\omega_{IF} t_{TS,3} + \Phi_F]$$

3. Updating the selection of an ADC and CSF matrix is done by setting start_activation=1 in the command, and selecting 2 buses using inputs sel_ADC and sel_CSF with the indices for the selection. In an example implementation, 4 bits are used for the CSF selection and 1-bit for the ADC selection and the start_activation command is given 8 cycles before first sample arrives at the input of the demod circuit 1008.

4. The demodulation unit receives 2 weights from the 2 buses selected by w_c and w_s. The weights are denoted here by $a^c_{TS}$ and $a^s_{TS}$.

The demodulation output is $$\sum_{TS=0}^{N} (R_{TS,0} + R_{TS,1} + R_{TS,2} + R_{TS,3})$$

where the summation is over all the time stamps since the accumulator was reset (8 cycles after the start activation in the example). The weighted sample is:

$$R_{TS,i} = S_{(TS),i} \cdot W_{(TS-4)}$$

where $$W_{TS} = a^c{}_{TS} \cos[\omega_{IF} t_{TS,i} + \Phi_F] + a^s{}_{TS} \sin[\omega_{IF} t_{TS,i} + \Phi_F]$$

Here is an example of a command to start activating the demodulation process:

Demod(start_activation=1; sel_ADC=imm0, sel_CSF=imm1,w_c=NA,w_s=NA)

This command may arrive several cycles before the arrival of the first sample at the demod input. Setting start_activation=1 enables the updating of a selected CSF matrix and a selected ADC. The indices for both are taken from the buses $imm_0$ and $imm_1$, and the updating process is time aligned by the logic.

The memory circuit 1010 can store, in one example implementation, 1024 vectors of 32 bits, each vector has an address. In order to write a new 32 bits vector of data coming from the bus, sel_data, to an address coming from the bus, sel_addr, wr_or_rd is set to write (e.g., 1=wr and 0=read). An example write command: $Mem_0$ (wr_or_rd=wr; sel_addr=$imm_0$, sel_data=$imm_1$). In order to read a new 32 bits vector of data from an address coming from the bus, sel_addr, wr_or_rd is set to read. The field sel_data is not relevant for a read. Example read command: $Mem_1$ (wr_or_rd=rd; sel_addr=$Imm_0$, sel_data=NA).

Each immediate memory circuit 1012 is operable to get values from the CSP program and output the value onto the corresponding Imm bus with minimal or no latency (e.g., in less than 1 clock cycle. Example command $Imm_1$ (input=1010101 . . . 10;)

Each keep circuit 1014 is operable to function as follows: if enable=1, the keep circuit 1014 updates the kept value to the value on its input. The keep circuit 1014 then starts outputs this new kept value until it is changed. If enable=0 it disregards the input value and keeps outputting the kept value. Example command: $Keep_1$ (enable=1; input=$Mem_0$).

The intra-analog circuits 1016 enable analog communication between CSPs of $410_0$-$410_{L-1}$ of pulsers $302_0$-$302_{L-1}$. Each intra-analog circuit 1016 is operable to get a 32 bits vector from each of a plurality (e.g., 10) of other CSP circuits 410, and selects one of those vectors based on the value of sel_CSP program input. If enable=1 it updates the Intra_an output to the value coming from the selected CSP. If enable=0 it keeps outputting the value of the previous cycle. As an example, assuming L=10, the command Intra_an$_1$ (enable=1, sel_CSP=7;) on CSP $410_0$ results in the intra_an$_1$ circuit of CSP $410_0$ updating its output according to the 32 bits vector arriving from CSP $410_7$ of pulser $302_7$.

The intra_dig circuits 1018 enables digital communication between CSPs of $410_0$-$410_{L-1}$ of pulsers $302_0$-$302_{L-1}$.

Each intra_dig circuit 1018 is operable to always gets 2-bits of digital information from each of a plurality (e.g., 10) other CSPs, and outputs a single 32 bits vector. In an example implementation, only 20-bits of the output vector are storing the Intra_dig information. If enable=1 the output vector is updated. If enable=0, the 20 relevant bits remain the same as in the previous cycle. As an example, assuming L=11, the command Intra_dig (enable=1;) on CSP $410_0$ results in the output of the Intra_dig circuit $410_0$ being updated according to the 20 digital bits coming from 10 other CSPs $410_1$-$410_{10}$.

The Boolean circuit 1020 is operable to perform any multi-variable Boolean function (in the example shown, 5-variable, and thus there are $2^{2^5}$ such different boolean functions). The specific function that will be used for a particular calculation is defined by the single 32 bit vector coming from the bus input func. Each bit in this vector is the result of the function for a specific combination of 5 digital parameters: a, b, c, d, and e. If we want for example to perform the boolean function a AND b AND c AND d AND e, it will correspond to the following truth table:

| a | b | c | d | e | func |
|---|---|---|---|---|------|
| 0 | 0 | 0 | 0 | 0 | 0 |
| 0 | 0 | 0 | 0 | 1 | 0 |
| 0 | 0 | 0 | 1 | 0 | 0 |
| . | . | . | . | . | . |
| . | . | . | . | . | . |
| . | . | . | . | . | . |
| 1 | 1 | 1 | 1 | 0 | 0 |
| 1 | 1 | 1 | 1 | 1 | 1 |

The values of the parameters a, b, . . . , e may be chosen based on parameters_group (which is, for example, a vector of 32 bits) and a plurality (e.g., 5) sel_parameter_index program inputs. Each sel_parameter_index may be 5 bits. As an example, to realize a AND b AND c AND d AND e with the fourth Boolean circuit $410_4$ of CSP $410_0$ and the following input a=1, b=1, c=1, d=1, e=0, and assuming in CSP $410_0$ that $Mem_1$=10 . . . 000 and $Mem_2$=000 . . . 01. Then the command $Bool_3$ (sel_parameters_index=[00000, 00001, 00010, 00011, 00100]; func=$Mem_1$, parameters_group=$Mem_2$,) gives an output of False.

The Dispatch circuits 1022 enables a CSP $410_1$ to dispatch a bus input to a destination external to the CSP $410_1$. An identifier of the destination may be specified in the name portion of the command (i.e., dispatch_<name> where <name> is replaced by the destination). In some embodiments, if the designated output is less than 32 bits, then the required amount of bits can be taken from any starting index. The dispatch output will be updated only if enable=1, otherwise it will keep playing the same value as in the previous clock cycle. In one implementation there are 15 possible destinations as shown in the table below. Each destination may be connected to a different output.

| Name | Hierarchy | Description |
|------|-----------|-------------|
| enable_ICP_jump | Flow | A single bit output to the CSP flow control indicating if to JUMP to a new address listed in the program - only relevant if the command's branching type is conditional if. |
| stream0 | Stream | Stream 32 bits from the bus |
| stream1 | | Stream 32 bits from the bus |
| CSP_stream_en | | A valid indication to stream data |
| update_S | CSF | The value of the spin frequency of the S matrix to be updated (32 bits) |

-continued

| Name | Hierarchy | Description |
| --- | --- | --- |
| update_C_0 | | The value of the 00 (10) element* of the C matrix (mixer correction) to be updated (18 bits) |
| update_C_1 | | The value of the 01 (11) element* of the C matrix (mixer correction) to be updated (18 bits) |
| update_g_0 | Reshaper | The value of the 00 (10) element* of the G matrix* (18 bits) |
| update_g_1 | | The value of the 01 (11) element* of the G matrix* (18 bits) |
| flag | | The flag for an If statement and conditional RETURN in the flow control of the sequencer (1 bit) |
| jump | Sequencer | The jump for the GOTO in the flow control of the sequencer (14 bits) |
| offset | | The length_offset of the instruction (20 bits) |
| seq_stream_en | | A single bit, that if asserted, 64 bits from the instruction (in the triggering timestamp) are sent to the stream manager. |
| intra_an | CSPs | Analog output to the Intra analog boxes of all the 10 CSPs (32 bits) |
| intra_dig_0 | | Digital output to the Intra digital boxes of all the 10 CSPs (1 bit)** |
| intra_dig_1 | | Digital output to the Intra digital boxes of all the 10 CSPs (1 bit)** |

*In this example implementation, in order to update the 4 elements of the correction/G matrix, 2 CSPs (of a pair of IQ pulsers) are required. The elements indices above that are not in parentheses are for a CSP of an I-pulser, while the elements indices that are in parentheses are for an ICP of a Q-pulser.
** In this example implementation, each CSP 410 dispatches 2 bits of information to all the other CSPs 410 of the other pulsers $302_0$-$302_{L-1}$ and each bit is on a different bus.

As an example, assuming $Mem_1$=11111 ... 110 in CSP $410_0$ of pulser $302_0$, the command Dispatch_flag(enable=1; input=$Mem_1$) results in the flag for an If statement in the flow control of the pulser $302_0$.

The Flow circuit 1024 of CSP 410$_1$ of pulser $302_1$ is a tool to control the flow of commands (from the program memory) to be executed by pulser $302_1$. The control circuitry 408 of pulser $302_1$ triggers an CSP program by sending setting valid high (valid=1). The Flow circuit 1024 of CSP 410| then reads the values of prog_delay and start_addr (coming from the pulser instruction), waits a number of clock cycles determined by the prog_delay, and then start carrying out the first command, specified by the start_addr. In an example implementation, the flow control has 5 different branching types:
1. Pause: Stop progressing.
2. Increment: Regular flow. Go to the next addr.
3. Conditional if: If enable_CSP_jump from the dispatch is set then jump to CSP_jump, otherwise go to the next address.
4. goSub: go to the CSP_jump. When subroutine is finished it continues to the next address.
    E.g: if in command 100 it is specified to go to subroutine starting in CSP_jump=20, it will execute command 100, 101, 20, 21, . . . , 36, 102. (Note that the subroutine is finished in address 36 in this example)
5. Return: Finish the subroutine and return to the 'mother' program. Due to the read latency the flow command may need to be asserted one or more (e.g., two) commands before the actual branching point.

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical implementation may comprise one or more application specific integrated circuit (ASIC), one or more field programmable gate array (FPGA), and/or one or more processor (e.g., x86, x64, ARM, PIC, and/or any other suitable processor architecture) and associated supporting circuitry (e.g., storage, DRAM, FLASH, bus interface circuits, etc.). Each discrete ASIC, FPGA, Processor, or other circuit may be referred to as "chip," and multiple such circuits may be referred to as a "chipset." Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to perform processes as described in this disclosure. Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to be configured (e.g., to load software and/or firmware into its circuits) to operate as a system described in this disclosure.

As used herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As used herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As used herein, the term "exemplary" means serving as a non-limiting example, instance, or illustration. As used herein, the terms "e.g.," and "for example" set off lists of one or more non-limiting examples, instances, or illustrations. As used herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.). As used herein, the term "based on" means "based at least in part on." For example, "x based on y" means that "x" is based at least in part on "y" (and may also be based on z, for example).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A system comprising:
a pulser comprising:
  a pulse computation and signal processing circuit (CSP) comprising a plurality of building blocks; and
  a pulse modification circuit, wherein:
    the CSP is configured to execute a program in real-time independently from a control flow of a quantum algorithm,
    the pulse modification circuit is configured dynamically according to the control flow of the quantum algorithm,
    the CSP is configured to selectively dispatch, according to the control flow of the quantum algorithm, one or more dispatch results and an outbound pulse from the plurality of building blocks,
    the one or more dispatch results comprise a matrix representation of a modification,
    the matrix representation of the modification comprises a plurality of rows and a plurality of columns,
    the pulse modification circuit is configured to generate the matrix representation in real-time according to one or more pulse operations specified by a digital control signal,
    the outbound pulse is represented by a vector, and
    the pulse modification circuit is configured to modify the outbound pulse according to the one or more dispatch results.

2. The system of claim 1, wherein:
each building block of the plurality of building blocks of the CSP is configured to operate in parallel with one or more different building blocks of the plurality of building blocks according to a fixed timing, and
each building block of the plurality of building blocks of the CSP is configured to receive, as an input, a result from a different building block of the plurality of building blocks.

3. The system of claim 1, wherein the pulser is configured to modify the control flow of the quantum algorithm according to the one or more dispatch results.

4. The system of claim 1, wherein the pulser is configured to modify one or more of an amplitude, a phase, a time and a frequency of the outbound pulse according to the one or more dispatch results.

5. The system of claim 1, wherein one or more of the building blocks are configured to determine a state of a quantum element according to a readout pulse.

6. The system of claim 1, wherein:
the plurality of building blocks of the CSP comprises different types of building blocks,
each building block of the plurality of building blocks is configured to update at least one of a plurality of register vectors in a CSP bus, and
the plurality of register vectors in the CSP bus is visible to all building blocks of the plurality of building blocks.

7. The system of claim 6, wherein the different types of building blocks comprise one or more of an arithmetic logic unit (ALU), a comparator logic units (CLU), a multiplier (Mult), a counter, a configurable delay and a programmable Boolean function.

8. The system of claim 6, wherein each of the plurality of building blocks is:
operably coupled to the CSP bus,
configured to receive one or more selectors, as input, to select an input from the CSP bus,
configured to receive an opcode, as an input, to determine an operation type, associated with a deterministic latency,
configured to receive a new input every cycle, and
configured to update the CSP bus.

9. The system of claim 6, wherein the plurality of building blocks comprises a storage block, and wherein the storage block is:
operably coupled to the CSP bus,
configured to receive a selector, as an input, to select a register vector from the CSP bus,
configured to receive an opcode, as an input, to determine an address and one of a read operation and a write operation,
associated with a deterministic latency,
configured to receive a new input every cycle, and
configured to update the CSP bus.

10. The system of claim 6, wherein the plurality of building blocks comprises an immediate building block, and wherein the immediate building block is:
configured to receive data from a CSP memory,
configured to store the data to the CSP bus, and
associated with a deterministic latency.

11. The system of claim 6, wherein the different types of building blocks comprise one or more signal processing building blocks.

12. The system of claim 6, wherein the different types of building blocks comprise a demodulation circuit configured to demodulate a feedback pulse from the quantum processor.

13. The system of claim 6, wherein the system comprises a plurality of pulsers and the pulser is a first pulser of the plurality of pulsers, and wherein the plurality of building blocks in the CSP of the first pulser comprises an intra-communication block, and wherein the intra-communication block is:
configured to receive a selector, as an input, to select information from the CSP bus,
associated with a deterministic latency,
configured to receive a new input every cycle, and
configured to update an intra-bus that is accessible by the plurality of pulsers.

14. The system of claim 13, wherein the intra-bus allows the CSP of the first pulser to share a register vector with a different CSP of a different pulser within a quantum controller, and wherein data on the shared register vector is one of analog data and digital data.

15. The system of claim 13, wherein a different pulser is configured to modify one or more of an amplitude, a phase, a time and a frequency of the outbound pulse according to the one or more dispatch results from the first pulser.

16. The system of claim 1, wherein the CSP comprises a dispatch circuit, and wherein the dispatch circuit is configured to:
  receive a CSP bus as input,
  receive a set of selects and enables from a CSP program memory,
  select a register vector from the CSP bus, and
  dispatch at least a portion of the selected register vector to a destination in a quantum controller.

17. The system of claim 1, wherein the CSP comprises a control flow circuit and a program memory, and wherein:
  the control flow circuit is configured to fetch a block of commands stored in the program memory cycle-by-cycle,
  the control flow circuit is configured to jump to a different command according to an IF statement, and
  the CSP is configured to execute the commands received from the control flow circuit.

18. The system of claim 17, wherein the control flow circuit is configured to:
  jump to a sub-routine at a different address, and
  return from the sub-routine to resume an operation of a main program.

19. The system of claim 17, wherein the control flow circuit is configured to pause a CSP command while maintaining a CSP bus state.

20. The system of claim 17, wherein the pulser is configured to modify a control flow of the CSP according to the one or more dispatch results.

* * * * *